United States Patent
Wu et al.

(10) Patent No.: US 12,432,954 B2
(45) Date of Patent: Sep. 30, 2025

(54) SEMICONDUCTOR DEVICE STRUCTURE WITH FIN AND METHOD FOR FORMING THE SAME

(71) Applicant: Taiwan Semiconductor Manufacturing Company, Ltd., Hsinchu (TW)

(72) Inventors: Zhiqiang Wu, Zhubei (TW); Kuo-An Liu, Hsinchu (TW); Kai Tak Lam, Hsinchu (TW); Meng-Yu Lin, New Taipei (TW); Chun-Fu Cheng, Zhubei (TW); Chieh-Chun Chiang, Taipei (TW); Chun-Hsiang Fan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 640 days.

(21) Appl. No.: 17/710,499

(22) Filed: Mar. 31, 2022

(65) Prior Publication Data
US 2023/0317829 A1 Oct. 5, 2023

(51) Int. Cl.
| | |
|---|---|
| *H10D 30/01* | (2025.01) |
| *H10D 30/62* | (2025.01) |
| *H10D 30/69* | (2025.01) |
| *H10D 62/822* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ...... *H10D 30/0243* (2025.01); *H10D 30/6211* (2025.01); *H10D 64/021* (2025.01); *H10D 84/013* (2025.01); *H10D 84/0147* (2025.01); *H10D 84/0158* (2025.01); *H10D 84/038* (2025.01); *H10D 30/6219* (2025.01)

(58) Field of Classification Search
CPC ........... H10D 30/0243; H10D 30/6211; H10D 64/021; H10D 84/013; H10D 84/0147; H10D 84/0158; H10D 84/038; H10D 30/6219; H10D 64/252; H10D 84/903; H10D 84/0107; H10F 30/2863
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |

(Continued)

*Primary Examiner* — Herve-Louis Y Assouman
(74) *Attorney, Agent, or Firm* — Birch, Stewart, Kolasch & Birch, LLP

(57) ABSTRACT

A method for forming a semiconductor device structure is provided. The method includes providing a substrate, a fin, and a semiconductor layer. The fin is over the substrate, the semiconductor layer is over the fin, the substrate and the fin are made of different materials, and the fin and the semiconductor layer are made of different materials. The method includes forming a dielectric layer over the semiconductor layer and the fin. The method includes forming a semiconductor structure over a sidewall of the dielectric layer. The method includes removing a first top portion of the dielectric layer over a top surface of the semiconductor layer. The method includes forming a gate over the semiconductor layer, the dielectric layer, and the semiconductor structure.

20 Claims, 37 Drawing Sheets

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2015/0200252 A1* | 7/2015 | Ching ............... H01L 29/785 438/435 |
| 2019/0148362 A1* | 5/2019 | Cheng ............... H10D 84/016 257/296 |
| 2019/0252524 A1* | 8/2019 | Hsu ................ H01L 21/76224 |

* cited by examiner

SEMICONDUCTOR DEVICE STRUCTURE WITH FIN AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a perspective view of the semiconductor device structure of FIG. 1A, in accordance with some embodiments.

FIG. 1F-1 is a perspective view of the semiconductor device structure of FIG. 1F, in accordance with some embodiments.

FIG. 1G-1 is a perspective view of the semiconductor device structure of FIG. 1G, in accordance with some embodiments.

FIG. 1H-1 is a perspective view of the semiconductor device structure of FIG. 1H, in accordance with some embodiments.

FIG. 1I-1 is a perspective view of the semiconductor device structure of FIG. 1I, in accordance with some embodiments.

FIG. 2A-1 is a perspective view of the semiconductor device structure of FIG. 2A, in accordance with some embodiments.

FIG. 2B-1 is a perspective view of the semiconductor device structure of FIG. 2B, in accordance with some embodiments.

FIG. 2E-1 is a perspective view of the semiconductor device structure of FIG. 2E, in accordance with some embodiments.

FIG. 2E-2 is a perspective view of a portion of the semiconductor device structure of FIG. 2E-1, in accordance with some embodiments.

FIG. 2H-1 is a perspective view of the semiconductor device structure of FIG. 2H, in accordance with some embodiments.

FIG. 2I-1 is a perspective view of the semiconductor device structure of FIG. 2I, in accordance with some embodiments.

FIG. 2J-1 is a perspective view of the semiconductor device structure of FIG. 2J, in accordance with some embodiments.

FIG. 2J-2 is a perspective view of a portion of the semiconductor device structure of FIG. 2J-1, in accordance with some embodiments.

DETAILED DESCRIPTION

Figure 1A:
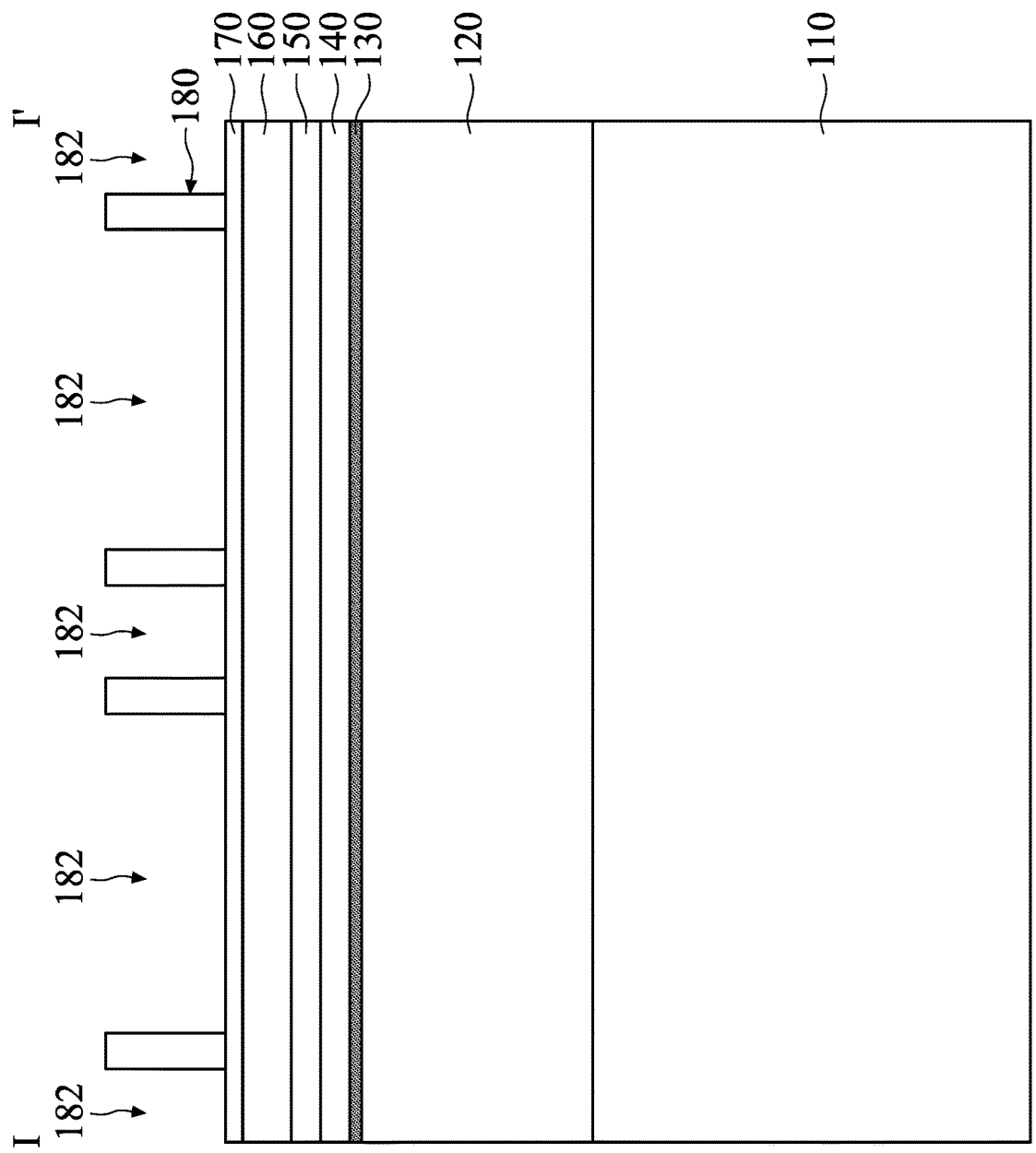
FIGS. 1A-1I are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figures 1, 1A:
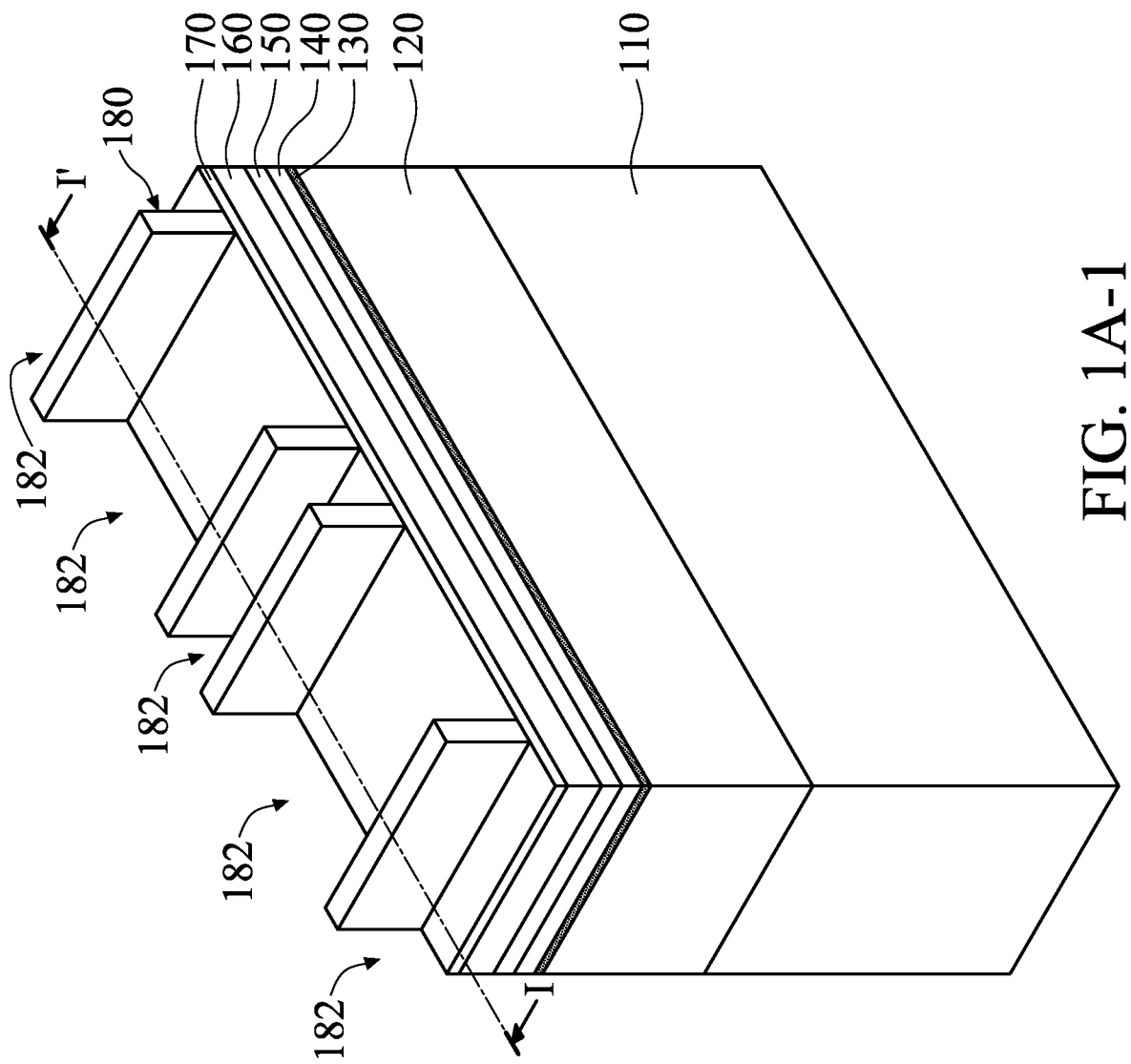

FIGS. 1A-1I are cross-sectional views of various stages of a process for forming a semiconductor device structure, in accordance with some embodiments. FIG. 1A-1 is a perspective view of the semiconductor device structure of FIG. 1A, in accordance with some embodiments. FIG. 1A is a cross-sectional view illustrating the semiconductor device structure along a sectional line I-I' in FIG. 1A-1, in accordance with some embodiments.

As shown in FIGS. 1A and 1A-1, a substrate 110 is provided, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, a fin material layer 120 is formed over the substrate 110, in accordance with some embodiments. The substrate 110 and the fin material layer 120 are made of different materials, in accordance with some embodiments. The fin material layer 120 is made of a semiconductor material such as SiGe, in accordance with some embodiments.

In some other embodiments, the fin material layer 120 is made of a compound semiconductor, such as silicon carbide, gallium arsenide, gallium phosphide, indium phosphide, indium arsenide, an alloy semiconductor, such as GaAsP, or a combination thereof.

The fin material layer 120 is formed using an epitaxial process or a deposition process, such as an atomic layer deposition (ALD) process, a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, or another applicable process, in accordance with some embodiments.

As shown in FIGS. 1A and 1A-1, an adhesive layer 130 is formed over the fin material layer 120, in accordance with some embodiments. The fin material layer 120 and the adhesive layer 130 are made of different materials, in accordance with some embodiments. The adhesive layer 130 is made of a dielectric material such as oxides (e.g., $SiO_2$ or SiON) or nitrides (SiN), in accordance with some embodiments.

The adhesive layer 130 is formed using a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, an atomic layer deposition (ALD) process, or a physical vapor deposition (PVD) process, in accordance with some embodiments.

Figure 4:
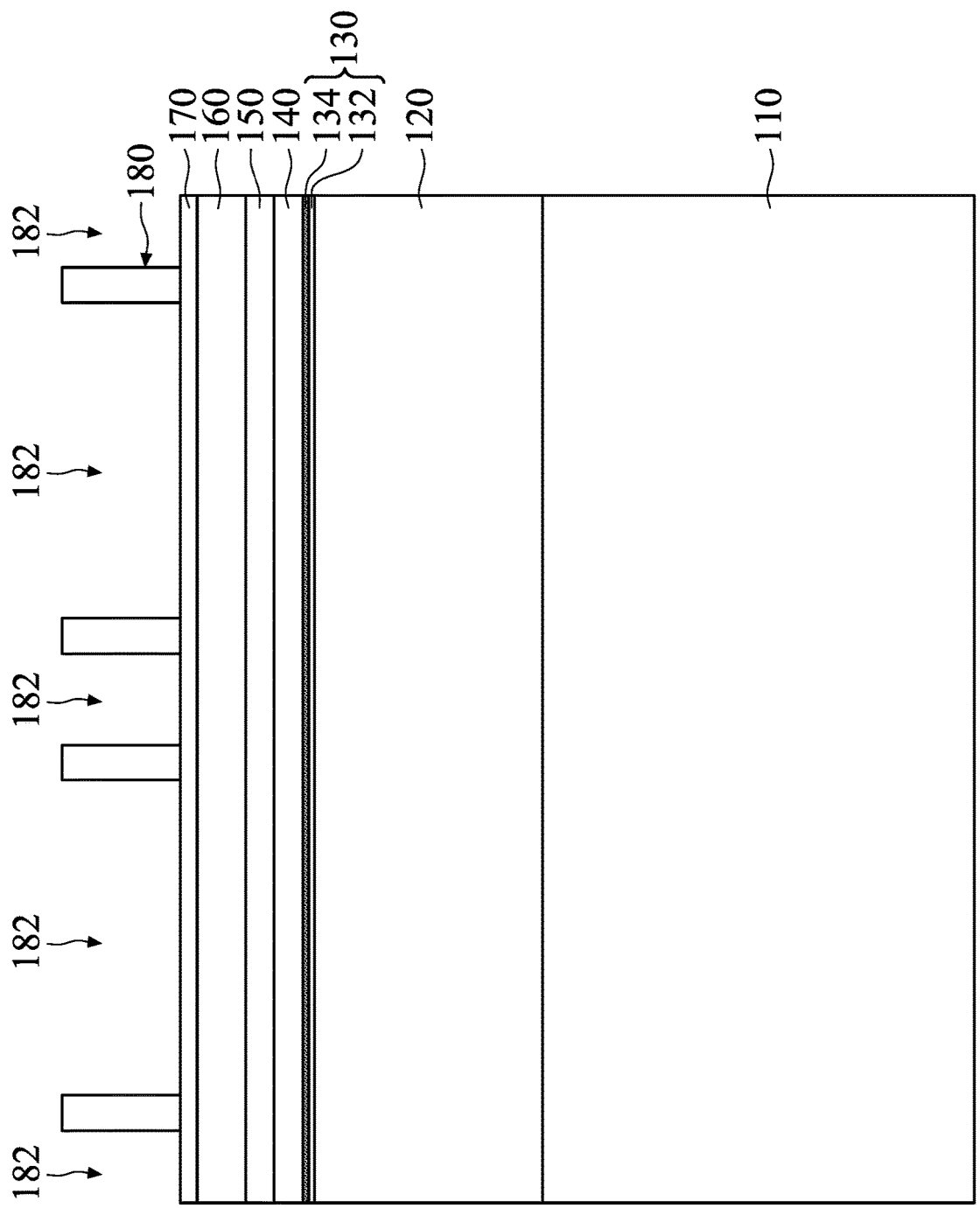
FIG. 4 is a cross-sectional view of a semiconductor device structure, in accordance with some embodiments.

The adhesive layer 130 may be a single layer structure (as shown in FIG. 1A) or a multilayer structure (as shown in FIG. 4). As shown in FIG. 4, the adhesive layer 130 has a lower layer 132 and an upper layer 134, in accordance with some embodiments. The lower layer 132 is between the fin material layer 120 and the upper layer 134, in accordance with some embodiments. The lower layer 132 is used to prevent the element (e.g., Ge) of the fin material layer 120 from diffusing into the chamber in the subsequent processes, in accordance with some embodiments.

The lower layer 132 is made of a semiconductor material, such as silicon in a single crystal structure, a polycrystal structure, or an amorphous structure, in accordance with some embodiments. The upper layer 134 is made of a dielectric material such as oxides (e.g., $SiO_2$ or SiON) or nitrides (SiN), in accordance with some embodiments.

As shown in FIGS. 1A and 1A-1, a semiconductor layer 140 is formed over the adhesive layer 130, in accordance with some embodiments. The semiconductor layer 140 is thicker than the adhesive layer 130, in accordance with some embodiments. The semiconductor layer 140 and the adhesive layer 130 are made of different materials, in accordance with some embodiments.

The fin material layer 120 and the semiconductor layer 140 are made of different materials, in accordance with some embodiments. The semiconductor layer 140 and the substrate 110 are made of the same material or similar materials, in accordance with some embodiments. Therefore, the lattice constant of the semiconductor layer 140 is the same as or similar to that of the substrate 110, in accordance with some embodiments. The semiconductor layer 140 is made of a semiconductor material, such as silicon in a single crystal structure, a polycrystal structure, or an amorphous structure, in accordance with some embodiments.

In some embodiments, the semiconductor layer 140 and the substrate 110 are made of Si, and the fin material layer 120 is made of SiGe. Therefore, the lattice constant of the semiconductor layer 140 or the substrate 110 is less than the lattice constant of the fin material layer 120, in accordance with some embodiments.

The semiconductor layer 140 is formed using an epitaxial process or a deposition process, such as an atomic layer deposition (ALD) process, a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, or another applicable process, in accordance with some embodiments.

As shown in FIGS. 1A and 1A-1, a mask layer 150 is formed over the semiconductor layer 140, in accordance with some embodiments. The mask layer 150 is made of nitrides (SiN or SiON), in accordance with some embodiments.

The mask layer 150 is formed using a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, an atomic layer deposition (ALD) process, or a physical vapor deposition (PVD) process, in accordance with some embodiments.

As shown in FIGS. 1A and 1A-1, a mask layer 160 is formed over the mask layer 150, in accordance with some embodiments. The mask layers 150 and 160 are made of different materials, in accordance with some embodiments.

In some embodiments, the mask layer 160 serves a buffer layer or an adhesive layer that is formed between the underlying mask layer 150 and an overlying mask layer formed in a subsequent process. The mask layer 160 may also be used as an etch stop layer when the overlying mask layer is removed or etched.

The mask layer 160 is made of oxides (e.g., $SiO_2$), in accordance with some embodiments. The mask layer 160 is formed using a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, an atomic layer deposition (ALD) process, or a physical vapor deposition (PVD) process, in accordance with some embodiments.

As shown in FIGS. 1A and 1A-1, a mask layer 170 is formed over the mask layer 160, in accordance with some embodiments. The mask layers 160 and 170 are made of different materials, in accordance with some embodiments. The mask layer 170 is made of oxides (e.g., $SiO_2$ or SiON) or nitrides (SiN), in accordance with some embodiments.

The mask layer 170 is formed using a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, an atomic layer deposition (ALD) process, or a physical vapor deposition (PVD) process, in accordance with some embodiments.

As shown in FIGS. 1A and 1A-1, a mask layer 180 is formed over the mask layer 170, in accordance with some embodiments. The mask layer 180 has trenches 182, in accordance with some embodiments. The trenches 182 expose portions of the mask layer 170, in accordance with some embodiments.

The mask layers 170 and 180 are made of different materials, in accordance with some embodiments. The mask layer 180 is made of a polymer material, such as a photoresist material, in accordance with some embodiments. The mask layer 180 is formed using a spin-on process and a photolithography process, in accordance with some embodiments.

For example, the photolithography process may include photoresist coating (e.g., spin-on coating), soft baking, mask aligning, exposure, post-exposure baking, developing the photoresist, rinsing and drying (e.g., hard baking).

Figure 1B:
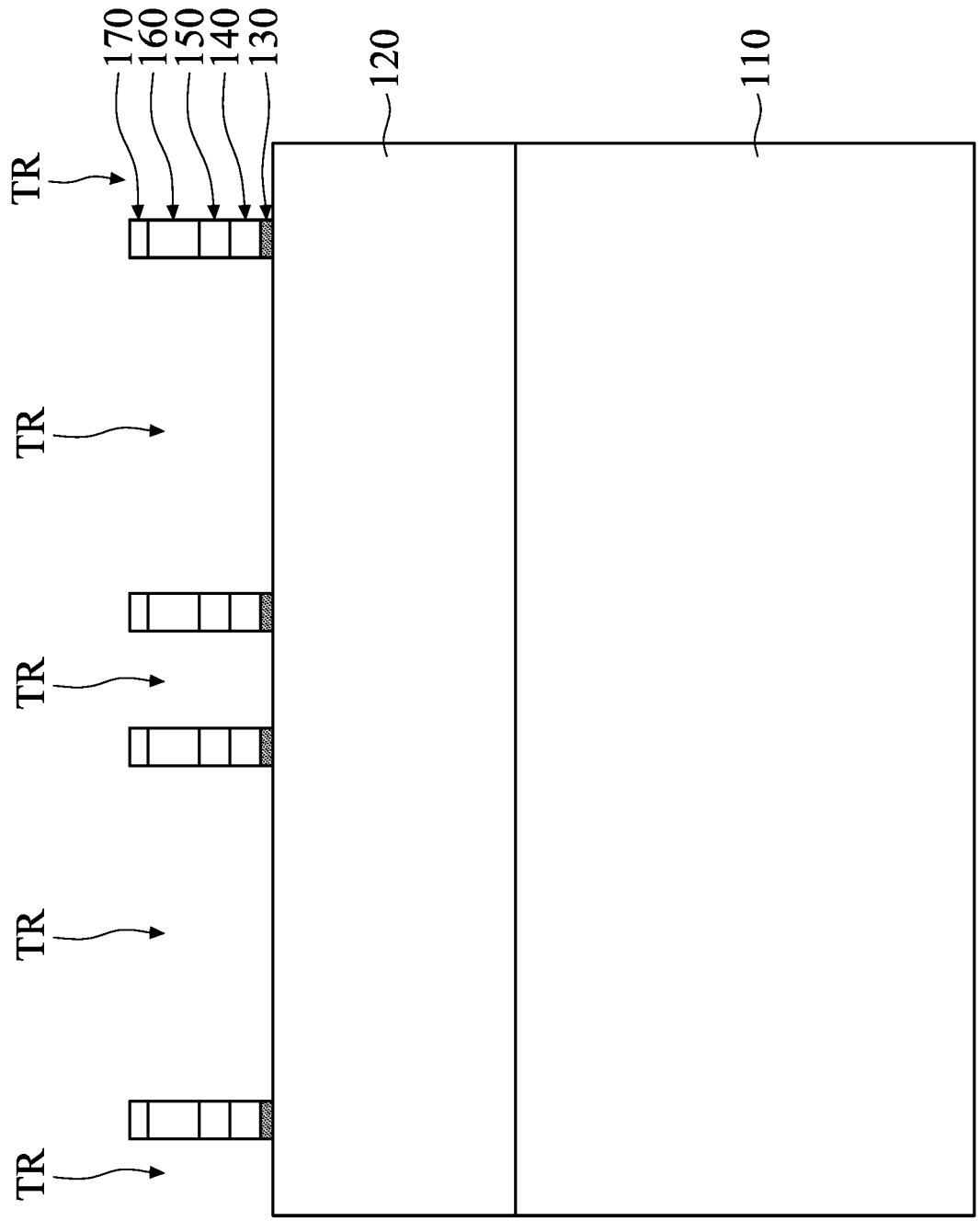

Thereafter, as shown in FIG. 1B, the portions of the mask layer 170 exposed by the trenches 182 of the mask layer 180 are removed through the trenches 182, in accordance with some embodiments. After the removal process, trenches TR are formed in the mask layer 170, in accordance with some embodiments. The trenches TR expose portions of the mask layer 160, in accordance with some embodiments.

The removal process includes an etching process, such as an anisotropic etching process, in accordance with some embodiments. The anisotropic etching process includes a dry etching process, such as a plasma etching process, a reactive ion etching (RIE) process, a neutral beam etching (NBE) process, the like, or a combination thereof, in accordance with some embodiments.

Afterwards, as shown in FIG. 1B, the portions of the mask layer 160 exposed by the trenches TR are removed through the trenches TR, in accordance with some embodiments. After the removal process, the trenches TR are further formed in the mask layer 160, in accordance with some embodiments. The trenches TR expose portions of the mask layer 150, in accordance with some embodiments.

The removal process includes an etching process, such as an anisotropic etching process, in accordance with some embodiments. The anisotropic etching process includes a dry etching process, such as a plasma etching process, a reactive ion etching (RIE) process, a neutral beam etching (NBE) process, the like, or a combination thereof, in accordance with some embodiments.

Afterwards, as shown in FIG. 1B, the portions of the mask layer 150 exposed by the trenches TR are removed through the trenches TR, in accordance with some embodiments. After the removal process, the trenches TR are further formed in the mask layer 150, in accordance with some embodiments. The trenches TR expose portions of the semiconductor layer 140, in accordance with some embodiments.

The removal process includes an etching process, such as an anisotropic etching process, in accordance with some embodiments. The anisotropic etching process includes a dry etching process, such as a plasma etching process, a reactive ion etching (RIE) process, a neutral beam etching (NBE) process, the like, or a combination thereof, in accordance with some embodiments.

Afterwards, as shown in FIG. 1B, the portions of the semiconductor layer 140 exposed by the trenches TR are removed through the trenches TR, in accordance with some embodiments. After the removal process, the trenches TR are further formed in the semiconductor layer 140, in accordance with some embodiments. The trenches TR expose portions of the adhesive layer 130, in accordance with some embodiments.

The removal process includes an etching process, such as an anisotropic etching process, in accordance with some embodiments. The anisotropic etching process includes a dry etching process, such as a plasma etching process, a reactive ion etching (RIE) process, a neutral beam etching (NBE) process, the like, or a combination thereof, in accordance with some embodiments.

Afterwards, as shown in FIG. 1B, the portions of the adhesive layer 130 exposed by the trenches TR are removed through the trenches TR, in accordance with some embodiments. After the removal process, the trenches TR are further formed in the adhesive layer 130, in accordance with some embodiments. The trenches TR expose portions of the fin material layer 120, in accordance with some embodiments.

The removal process includes an etching process, such as an anisotropic etching process, in accordance with some embodiments. The anisotropic etching process includes a dry etching process, such as a plasma etching process, a reactive ion etching (RIE) process, a neutral beam etching (NBE) process, the like, or a combination thereof, in accordance with some embodiments. As shown in FIG. 1B, the mask layer 180 is consumed by the aforementioned removal processes, in accordance with some embodiments.

Figure 1C:
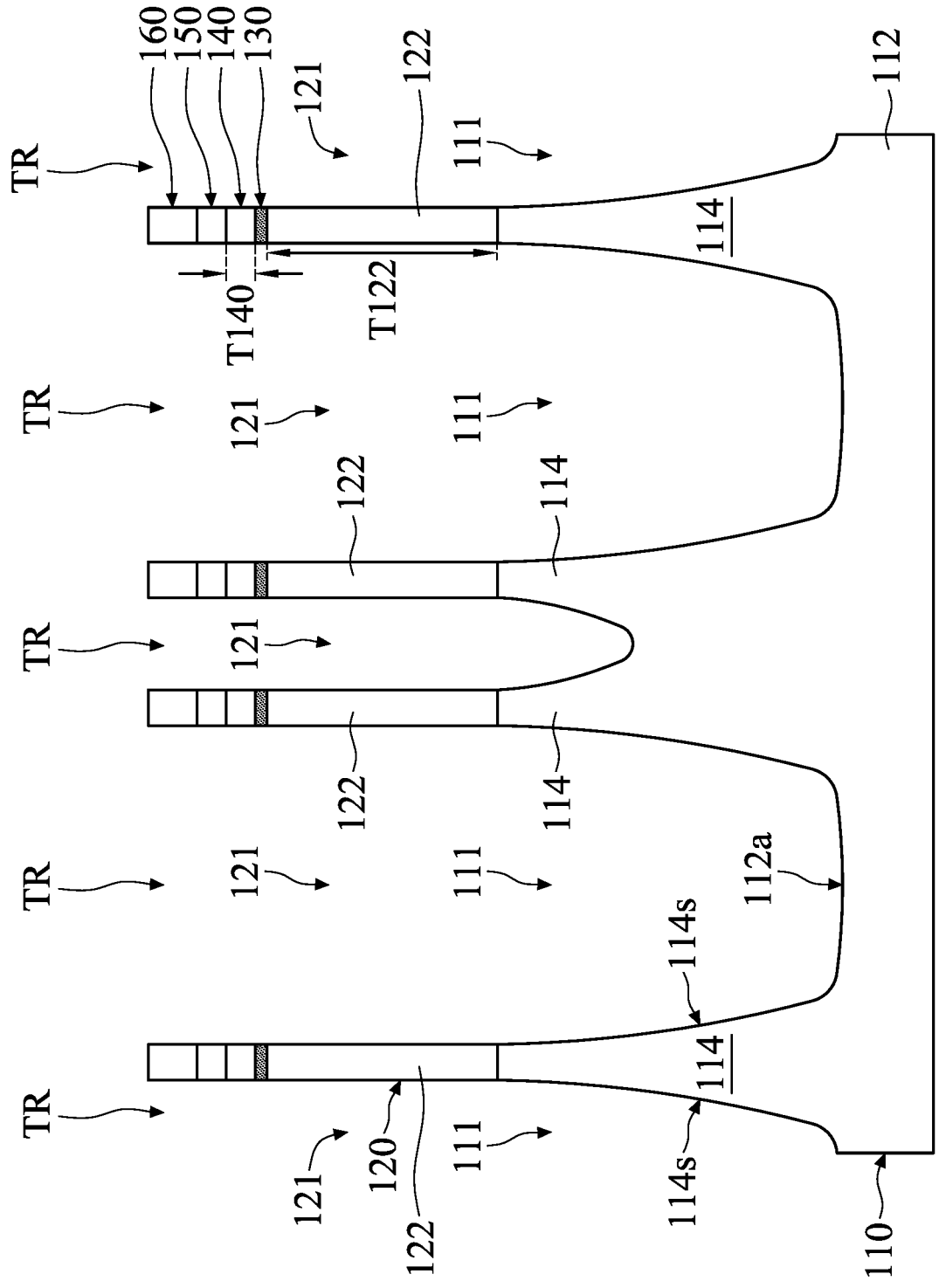

As shown in FIG. 1C, the portions of the fin material layer 120 exposed by the trenches TR are removed through the trenches TR, in accordance with some embodiments. After the removal process, trenches 121 are formed in the fin material layer 120, in accordance with some embodiments. The trenches 121 expose portions of the substrate 110, in accordance with some embodiments. The remaining fin material layer 120 forms fins 122, in accordance with some embodiments.

Since the material of the fins 122 is different from the material of the substrate 110, the lattice constant of the fins 122 is different from that of the substrate 110, in accordance with some embodiments. Therefore, the fins 122 tend to wiggle, in accordance with some embodiments. Since the semiconductor layer 140 and the substrate 110 have the same lattice constant or similar lattice constants, the semiconductor layer 140 is able to constrain the wiggling of the fins 122, in accordance with some embodiments. The wiggling of the upper portion and the lower portion of the fins 122 is constrained by the semiconductor layer 140 and the substrate 110, in accordance with some embodiments. Therefore, the yield of the fins 122 is improved, in accordance with some embodiments.

The fin 122 has a thickness T122, in accordance with some embodiments. The semiconductor layer 140 has a thickness T140, in accordance with some embodiments. The thickness T140 ranges from about 15 nm to about 20 nm, in accordance with some embodiments. The thickness T122 is greater than or equal to the thickness T140, in accordance with some embodiments. In some embodiments, a ratio of the thickness T140 to the thickness T122 ranges from about 0.01 to about 1.

If the ratio of the thickness T140 to the thickness T122 is less than 0.01, the semiconductor layer 140 may be too thin to reduce the wiggling of the fins 122, in accordance with some embodiments. If the ratio of the thickness T140 to the thickness T122 is greater than 1, the semiconductor layer 140 may be too thick and occupy a large height space.

The removal process includes an etching process, such as an anisotropic etching process, in accordance with some embodiments. The anisotropic etching process includes a dry etching process, such as a plasma etching process, a reactive ion etching (RIE) process, a neutral beam etching (NBE) process, the like, or a combination thereof, in accordance with some embodiments.

As shown in FIG. 1C, the portions of the substrate 110 exposed by the trenches 121 are removed through the trenches 121, in accordance with some embodiments. After the removal process, trenches 111 are formed in the substrate 110, in accordance with some embodiments. The removal process includes an etching process, such as an anisotropic etching process, in accordance with some embodiments.

The anisotropic etching process includes a dry etching process, such as a plasma etching process, a reactive ion etching (RIE) process, a neutral beam etching (NBE) process, the like, or a combination thereof, in accordance with some embodiments.

The dry etching process may be performed using a process gas including fluorine-based etchant gas. For example, the process gas may include $SF_6$, $C_xF_y$ (x and y are both integers), $NF_3$ or a combination thereof. As shown in FIG. 1C, the mask layer 170 is consumed by the aforementioned removal process, in accordance with some embodiments.

After the removal process, the substrate 110 has a base portion 112 and fin portions 114, in accordance with some embodiments. The fin portions 114 are over the base portion 112, in accordance with some embodiments. The fin portions 114 are spaced apart from each other, in accordance with some embodiments. If two adjacent fin portions 114 are spaced apart by a small distance, bottom portions of the fin portions 114 may merge with each other.

The fin portion 114 has opposite sidewalls 114S, in accordance with some embodiments. In some embodiments, the sidewalls 114S are tapered sidewalls. For example, each of the fin portions 114 has a width that gradually increases from the top portion to the lower portion. The base portion 112 has a top surface 112a, in accordance with some embodiments.

Figure 1D:
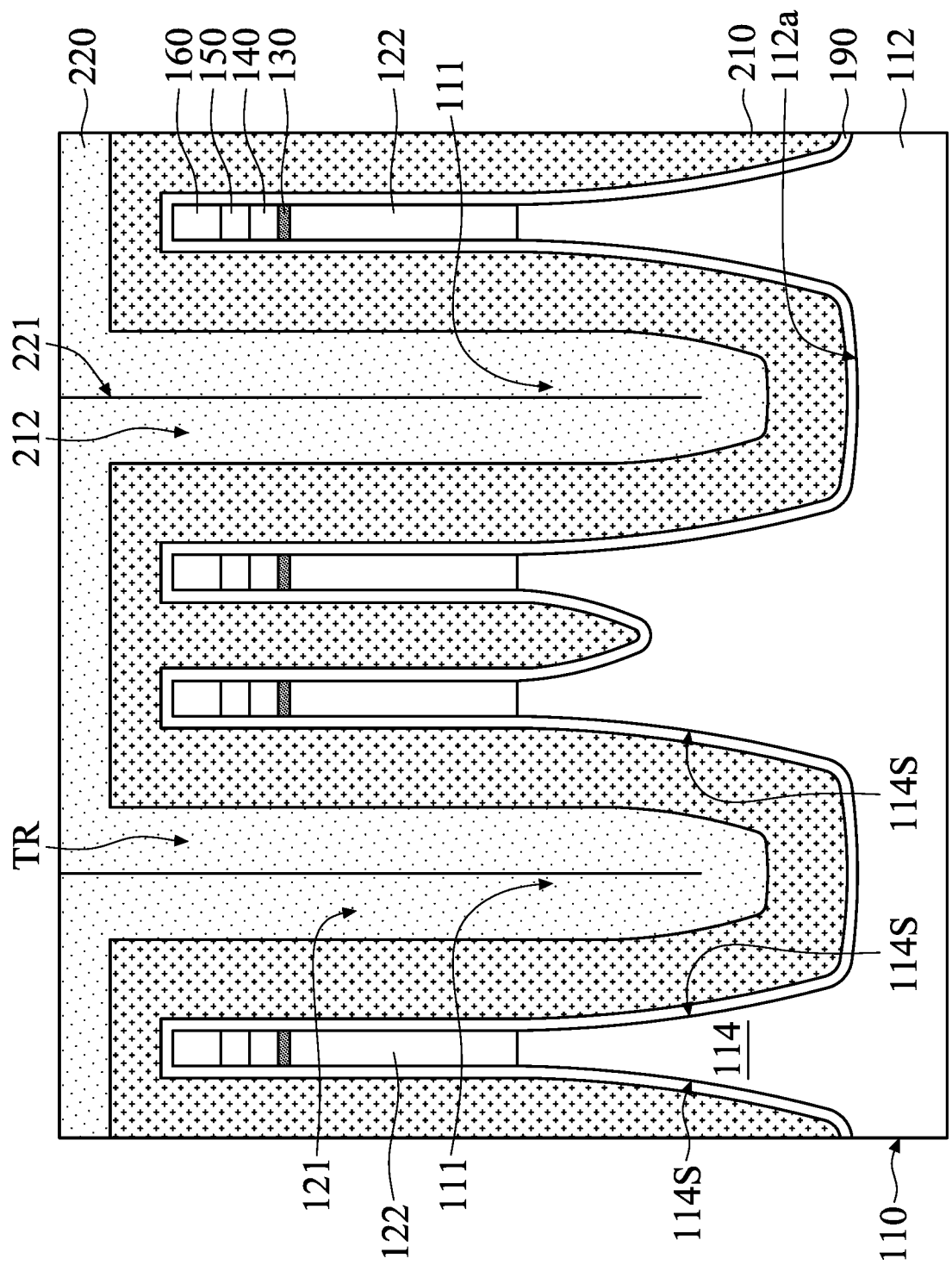

As shown in FIG. 1D, a liner layer 190 is formed over the base portion 112 and the fin portions 114, in accordance with some embodiments. The liner layer 190 conformally covers the top surface 112a of the base portion 112 and the sidewalls 114S of the fin portions 114, in accordance with some embodiments. The liner layer 190 includes oxide (such as silicon oxide), in accordance with some embodiments.

In some embodiments, the liner layer 190 is formed using a deposition process, such as a chemical vapor deposition (CVD) process, an atomic layer deposition (ALD) process, or a physical vapor deposition (PVD) process. In some other embodiments (not shown), the liner layer 190 is formed using a thermal oxidation process.

As shown in FIG. 1D, a dielectric layer 210 is formed over the liner layer 190, in accordance with some embodiments. The dielectric layer 210 conformally covers the liner layer 190, in accordance with some embodiments. In some embodiments, the dielectric layer 210 is made of oxide (such as silicon oxide), fluorosilicate glass (FSG), a low-k dielectric material, and/or another suitable dielectric material. The dielectric layer 210 may be deposited using an atomic layer deposition (ALD) process, a chemical vapor deposition (CVD) process, or another applicable process.

As shown in FIG. 1D, a dummy dielectric layer 220 is formed over the dielectric layer 210, in accordance with some embodiments. The trenches 212 of the dielectric layer 210 are filled with the dummy dielectric layer 220, in accordance with some embodiments. The portions of the dummy dielectric layer 220 over inner walls of the trench 212 are merged with each other, in accordance with some embodiments. The boundary 221 between the portions of the dummy dielectric layer 220 over different inner walls of the trench 212 may remain.

The dummy dielectric layer 220 is made of oxide (e.g., silicon oxide), nitride (e.g., silicon nitride, silicon carbon nitride, silicon oxycarbon nitride, titanium nitride, or tantalum nitride), carbide (e.g., silicon oxycarbide), metal oxide (e.g., oxides of Li, Be, Mg, Ca, Sr, Sc, Y, Zr, Al, La, Ce, Pr, Nd, Sm, Eu, Gd, Tb, Dy, Ho, Hf, Er, Tm, Yb, Lu, and/or mixtures thereof), or another suitable insulating material, in accordance with some embodiments.

In some embodiments, the dummy dielectric layer 220 and the dielectric layer 210 are made of different materials. Therefore, the dummy dielectric layer 220 and the dielectric layer 210 have different etching rates, in accordance with some embodiments. The dummy dielectric layer 220 is formed using a deposition process, such as a chemical vapor deposition (CVD) process, such as a flowable chemical vapor deposition (FCVD) process, an atomic layer deposition (ALD) process, or a physical vapor deposition (PVD) process, in accordance with some embodiments.

Figure 1E:
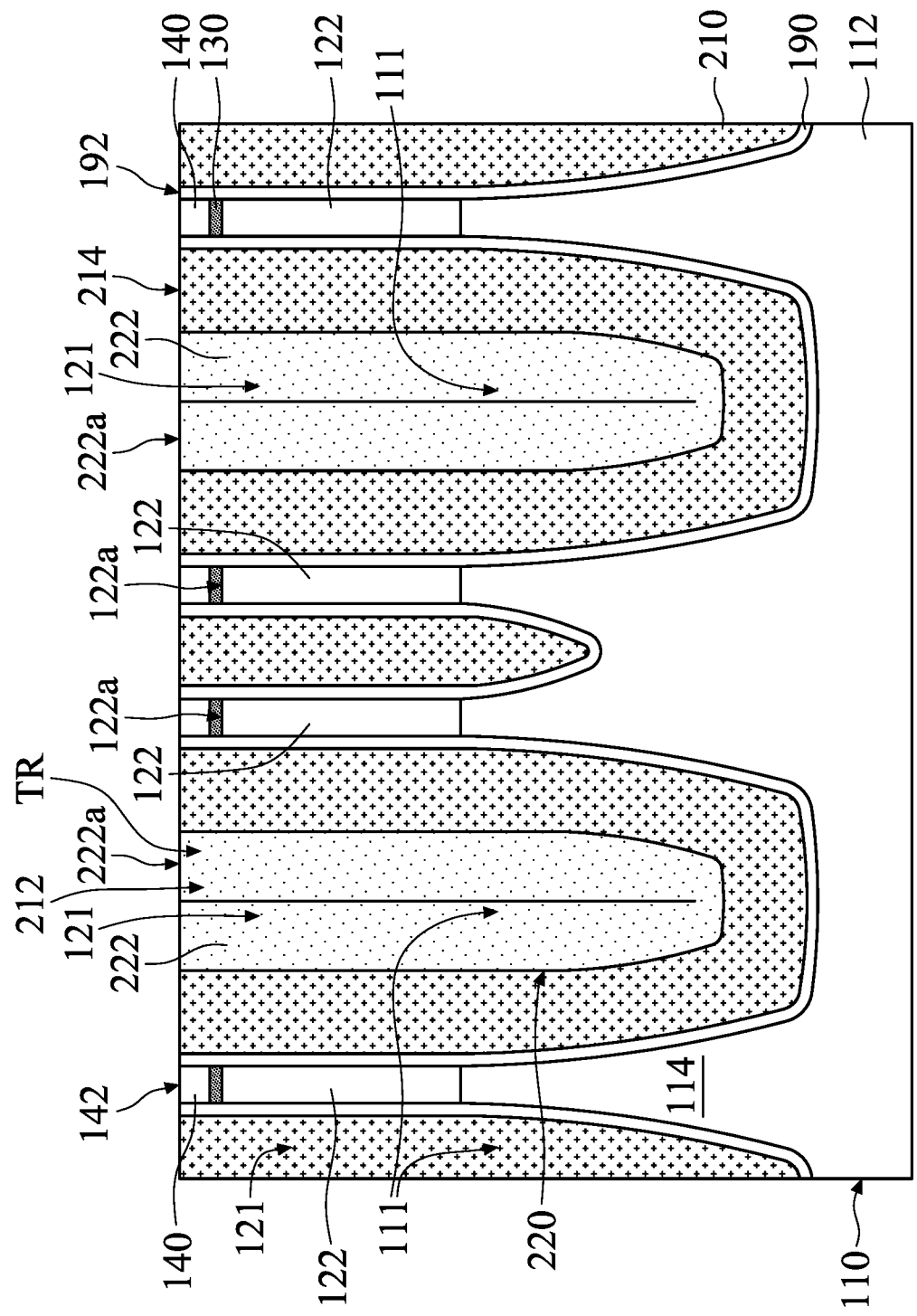

As shown in FIG. 1E, top portions of the dummy dielectric layer 220, the dielectric layer 210, and the liner layer 190, and the mask layers 150 and 160 are removed, in accordance with some embodiments. In some embodiments, top portions of the semiconductor layer 140 are also removed.

After the removal process, the dummy dielectric layer 220 remaining in the trenches 212 forms dummy fins 222, in accordance with some embodiments. The dummy fins 222 are separated from each other by the fins 122, the liner layer 190, and the dielectric layer 210, in accordance with some embodiments. The dummy fins 222 are over the substrate 110 and spaced apart from the fins 122, in accordance with some embodiments. In some embodiments, a top surface 122a of the fin 122 is lower than a top surface 222a of the dummy fin 222.

In some embodiments, the top surfaces 222a, 192, 214 and 142 of the dummy fins 222, the liner layer 190, the dielectric layer 210, and the semiconductor layer 140 are substantially coplanar with (or aligned with) each other, in accordance with some embodiments. The term "substantially coplanar" in the application may include small deviations from coplanar geometries. The deviations may develop during the manufacturing process.

The removal process includes performing a thinning process to a top side of the dummy dielectric layer 220, in accordance with some embodiments. The thinning process includes a chemical mechanical polishing (CMP) process, in accordance with some embodiments.

Figure 1F:
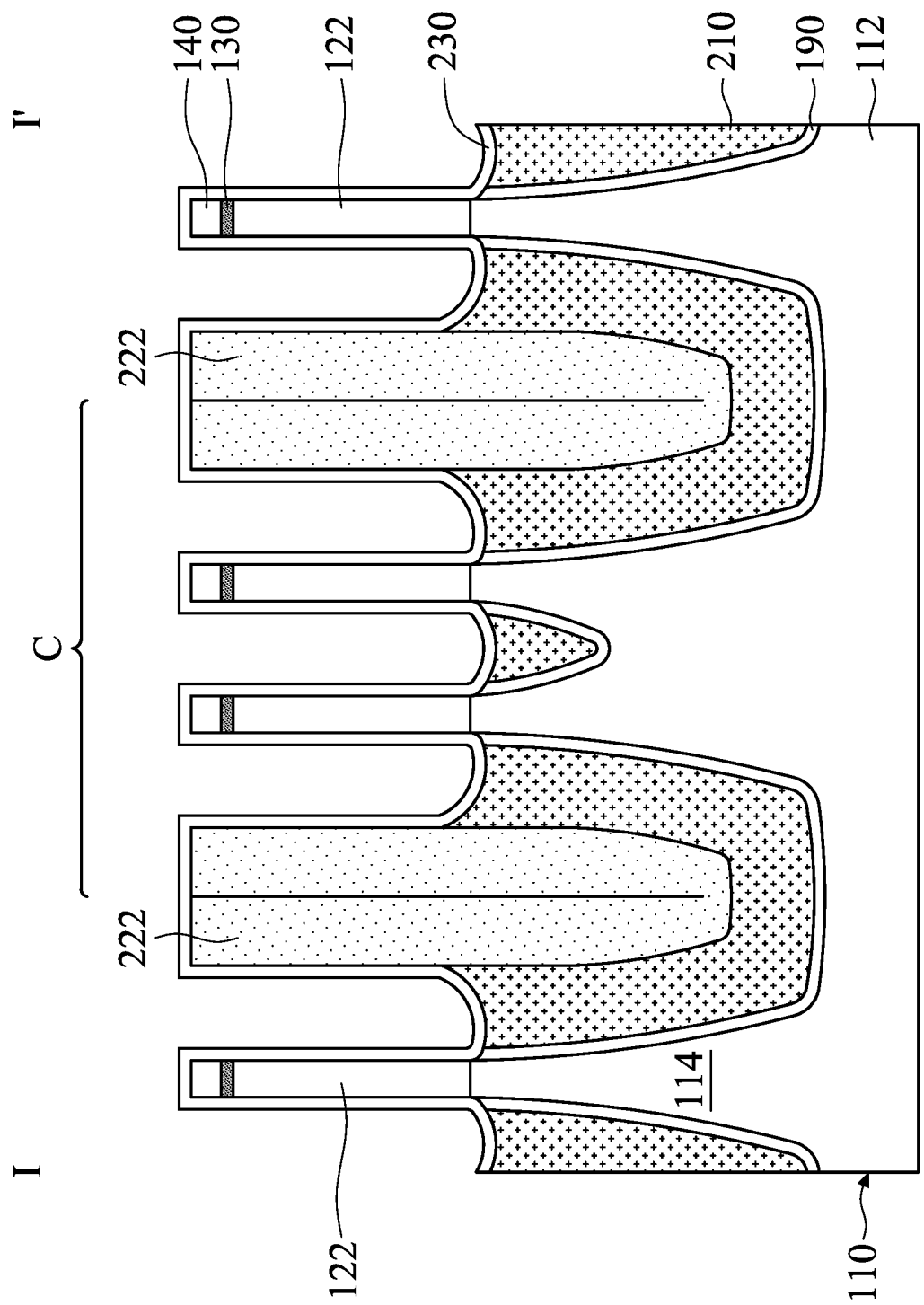
Figures 1, 1F:
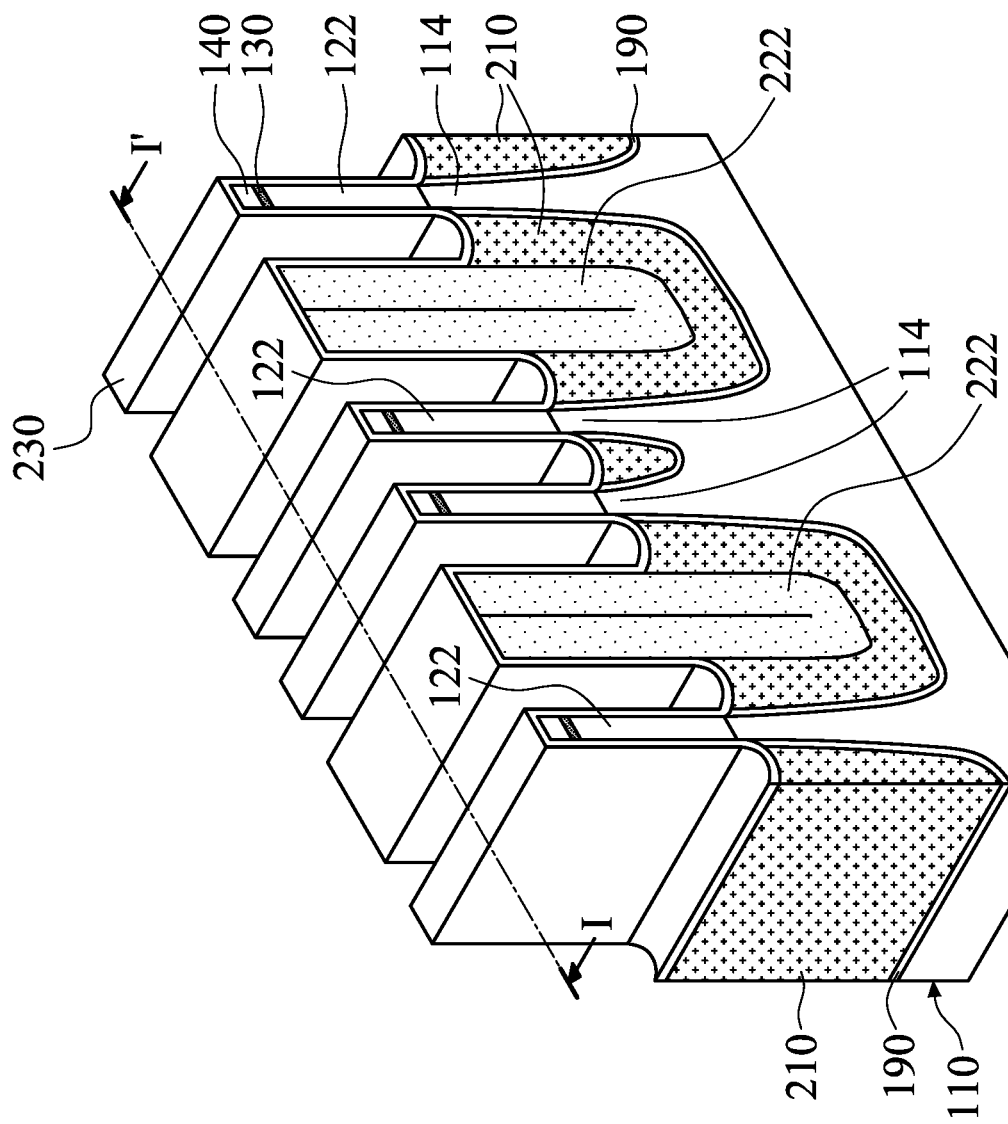

FIG. 1F-1 is a perspective view of the semiconductor device structure of FIG. 1F, in accordance with some embodiments. FIG. 1F is a cross-sectional view illustrating the semiconductor device structure along a sectional line I-I' in FIG. 1F-1, in accordance with some embodiments.

As shown in FIGS. 1F and 1F-1, upper portions of the dielectric layer 210 and the liner layer 190 are removed, in accordance with some embodiments. The removal process includes an etching process, such as a dry etching process or a wet etching process, in accordance with some embodiments.

As shown in FIGS. 1F and 1F-1, a gate dielectric layer 230 is formed over the fins 122, the adhesive layer 130, the semiconductor layer 140, the liner layer 190, the dielectric layer 210, and the dummy fins 222, in accordance with some embodiments.

The gate dielectric layer 230 conformally covers the fins 122, the adhesive layer 130, the semiconductor layer 140, the liner layer 190, the dielectric layer 210, and the dummy fins 222, in accordance with some embodiments. The gate dielectric layer 230 is in direct contact with the fins 122, the adhesive layer 130, the semiconductor layer 140, the liner layer 190, the dielectric layer 210, and the dummy fins 222, in accordance with some embodiments.

The adhesive layer 130, the fins 122, and the semiconductor layer 140 are made of different materials, in accordance with some embodiments. The gate dielectric layer 230 is made of an insulating material, such as oxide (e.g., silicon oxide), in accordance with some embodiments.

Figure 1G:
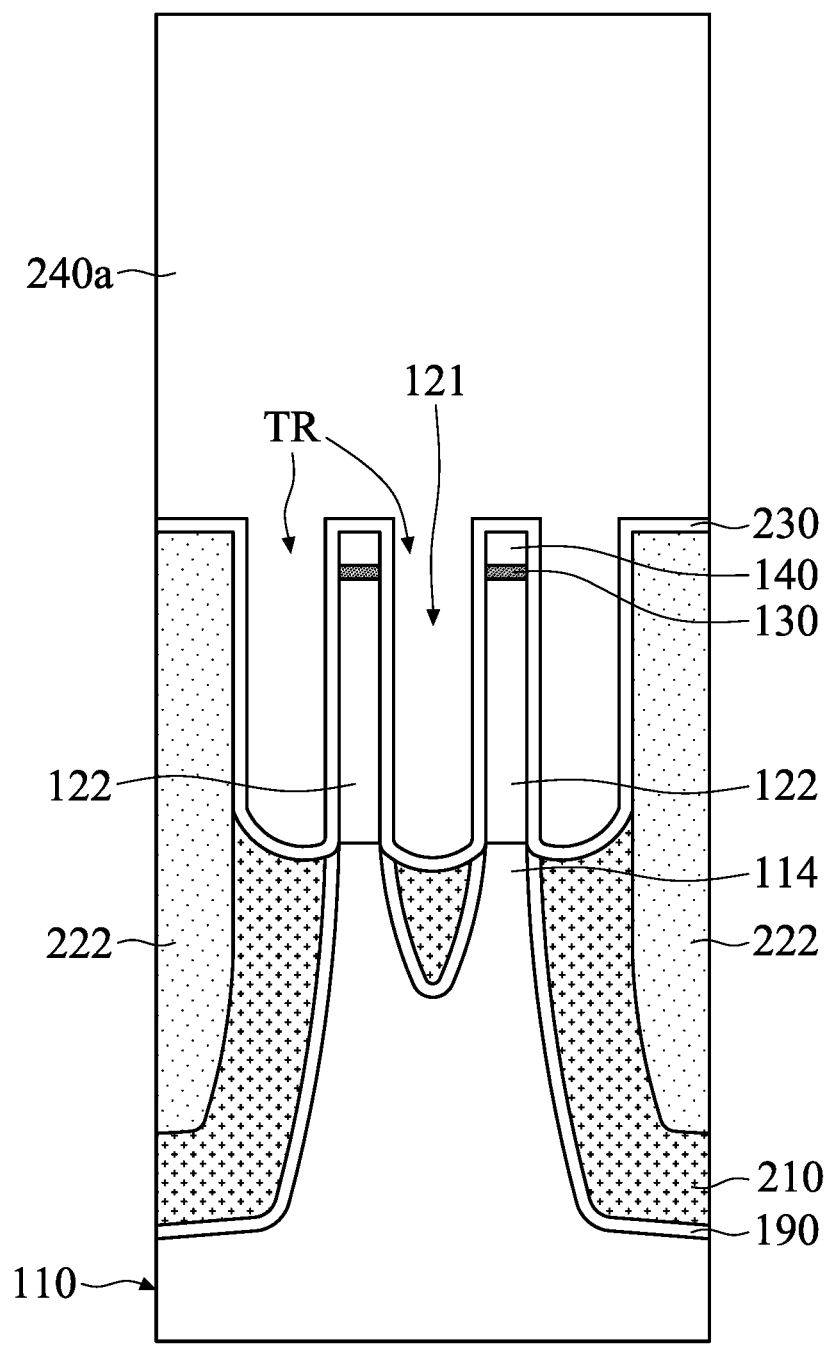
Figures 1, 1G:
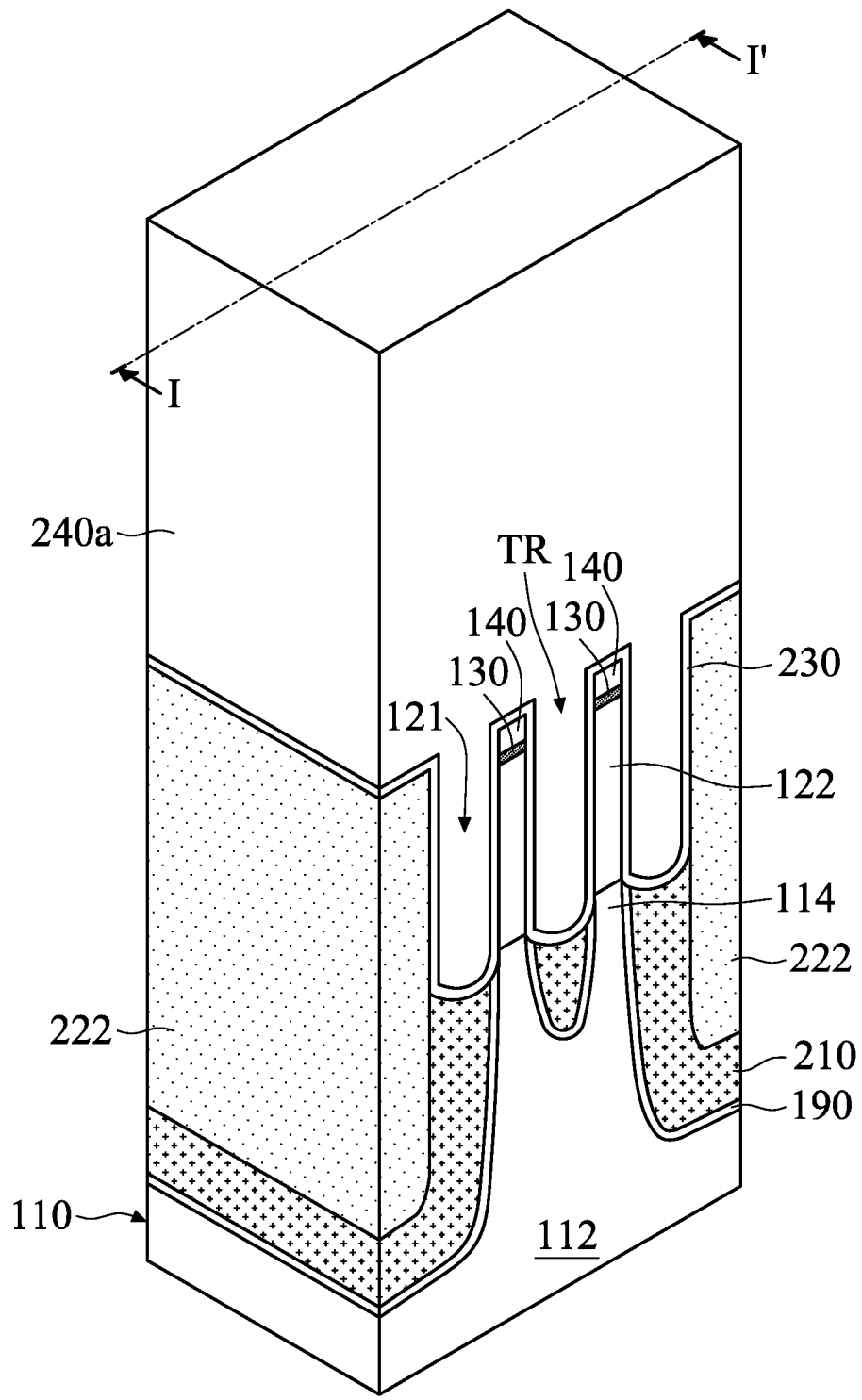

FIG. 1G-1 is a perspective view of the semiconductor device structure of FIG. 1G, in accordance with some embodiments. FIG. 1G is a cross-sectional view illustrating the semiconductor device structure along a sectional line I-I' in FIG. 1G-1, in accordance with some embodiments. As shown in FIGS. 1G and 1G-1, a semiconductor material layer 240a is formed over the dielectric layer 230, in accordance with some embodiments.

The semiconductor material layer 240a is thicker than the dielectric layer 230, in accordance with some embodiments. The semiconductor material layer 240a and the dielectric layer 230 are made of different materials, in accordance with some embodiments. The semiconductor material layer 240a is made of a semiconductor material, such as silicon in a polycrystal structure or an amorphous structure, in accordance with some embodiments.

The semiconductor material layer 240a is formed using an epitaxial process or a deposition process, such as an atomic layer deposition (ALD) process, a chemical vapor deposition (CVD) process, or another applicable process, in accordance with some embodiments.

Figure 1H:
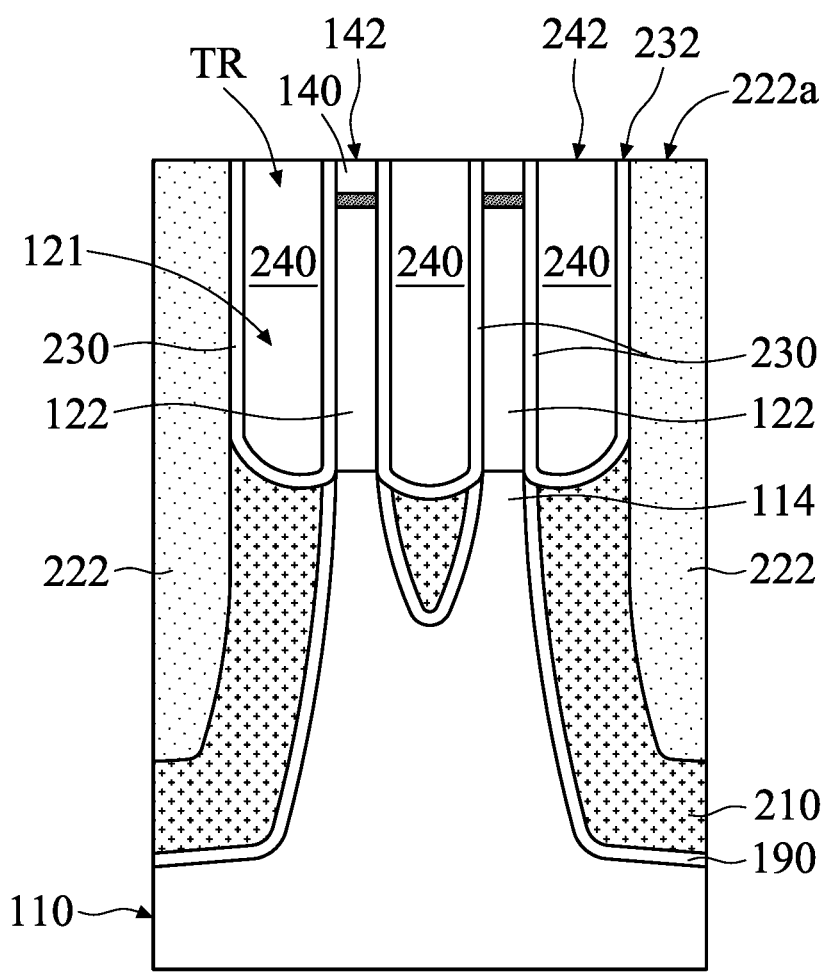
Figures 1, 1H:
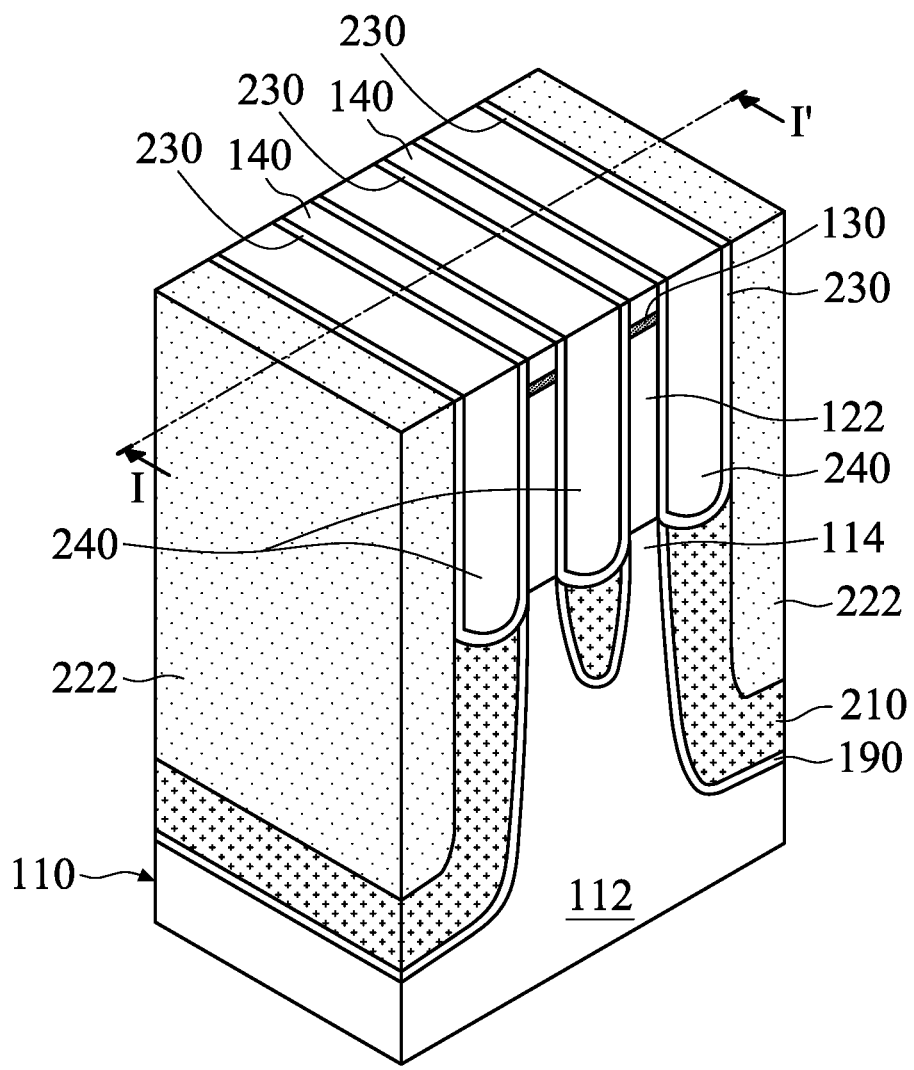

FIG. 1H-1 is a perspective view of the semiconductor device structure of FIG. 1H, in accordance with some embodiments. FIG. 1H is a cross-sectional view illustrating the semiconductor device structure along a sectional line I-I' in FIG. 1H-1, in accordance with some embodiments. As shown in FIGS. 1H and 1H-1, a planarization process is performed over the semiconductor material layer 240a until the top surface 142 of the semiconductor layer 140 is exposed, in accordance with some embodiments.

As shown in FIGS. 1G-1, 1H and 1H-1, top portions of the semiconductor material layer 240a and the dielectric layer 230 outside of the trenches TR and 121 are removed, in accordance with some embodiments. The semiconductor material layer 240a remaining in the trenches TR and 121 forms a semiconductor structure 240, in accordance with some embodiments.

Figure 1I:
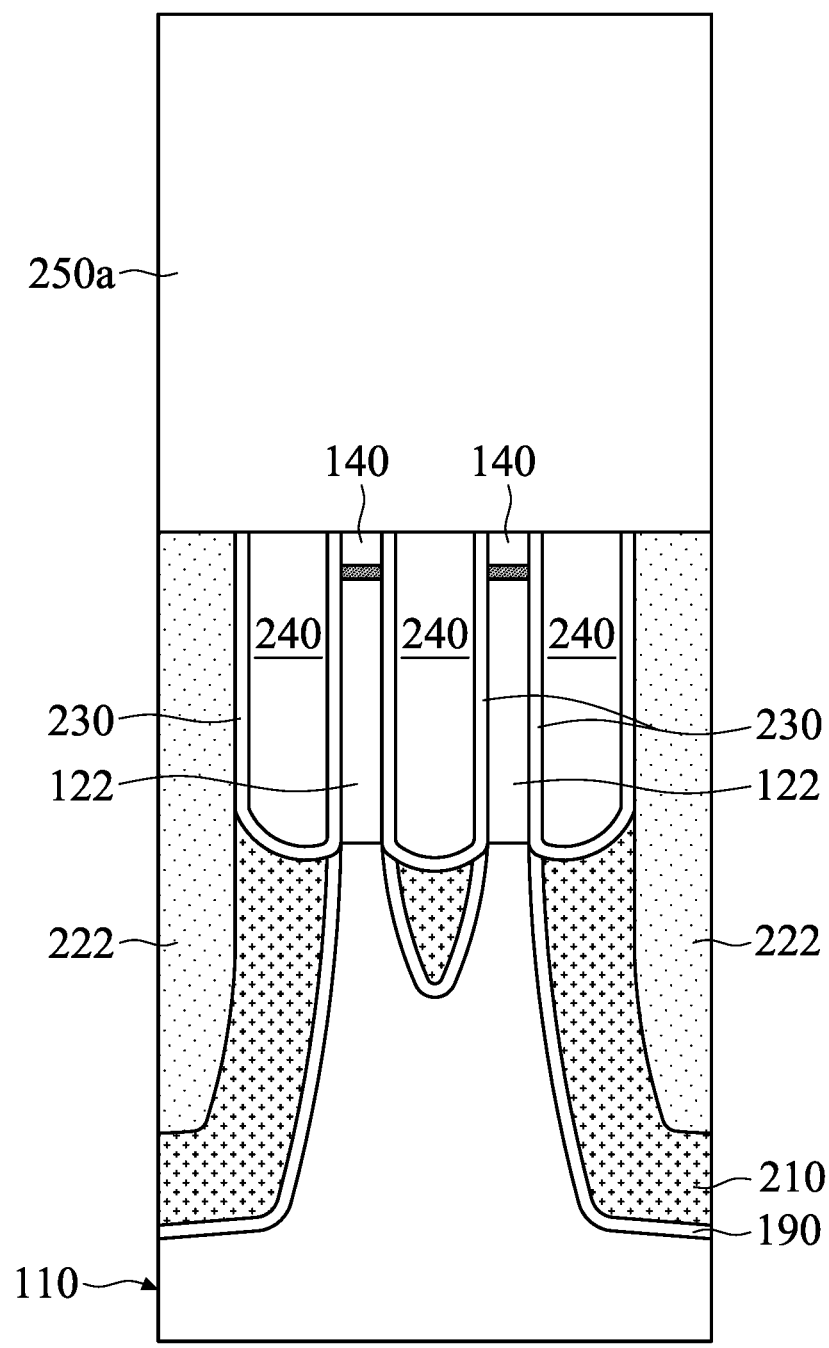
Figures 1, 1I:
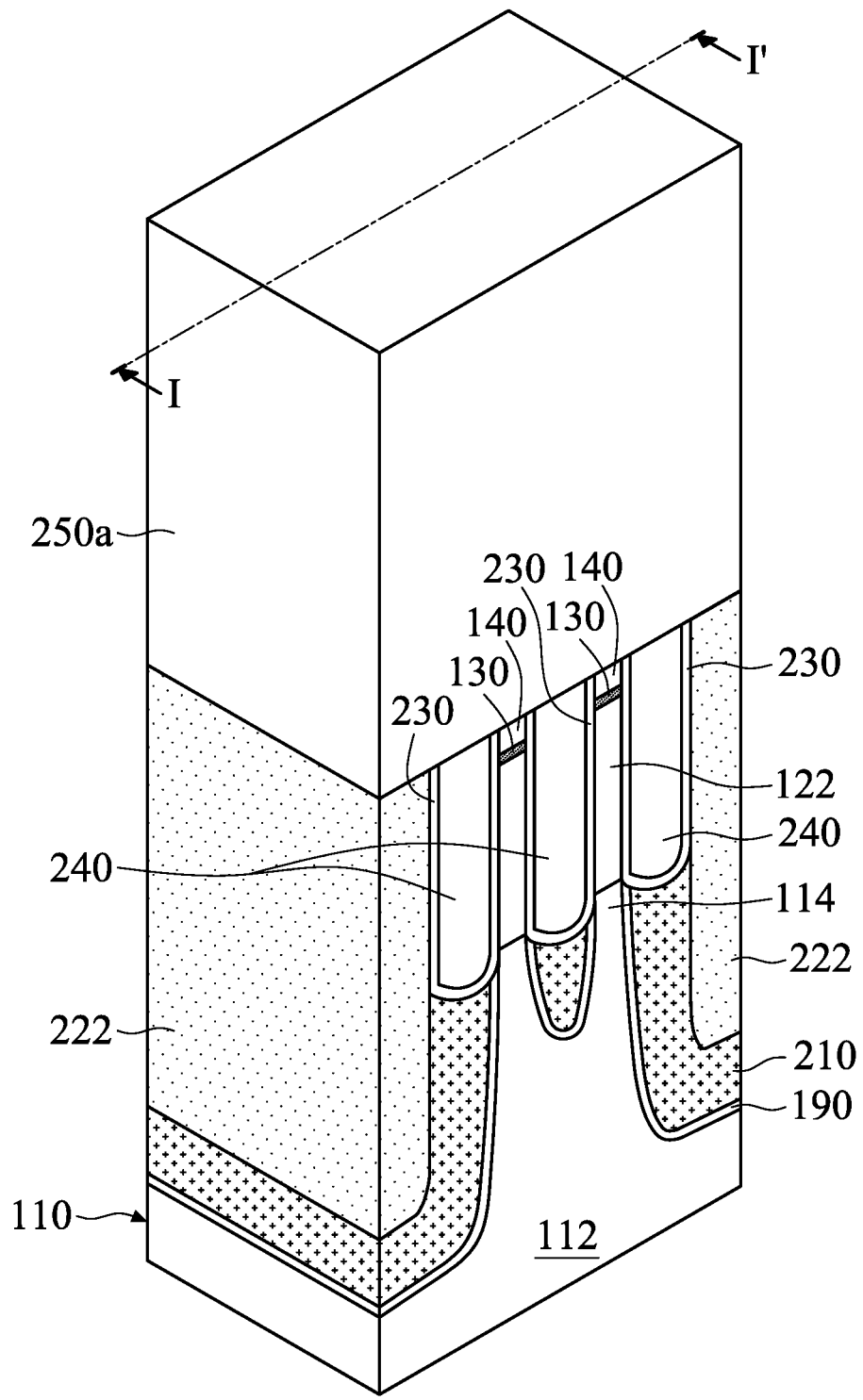

FIG. 1I-1 is a perspective view of the semiconductor device structure of FIG. 1I, in accordance with some embodiments. FIG. 1I is a cross-sectional view illustrating the semiconductor device structure along a sectional line I-I' in FIG. 1I-1, in accordance with some embodiments. As shown in FIGS. 1I and 1I-1, a gate layer 250a is formed over the semiconductor layer 140, the dielectric layer 230, and the semiconductor structure 240, in accordance with some embodiments.

The gate layer 250a and the semiconductor layer 140 are made of the same material or similar materials, in accordance with some embodiments. In some embodiments, the semiconductor structure 240, the gate layer 250a and the semiconductor layer 140 are made of the same material or similar materials. The gate layer 250a is made of a semiconductor material, such as silicon in a polycrystal structure or an amorphous structure, in accordance with some embodiments.

The gate layer 250a is formed using an epitaxial process or a deposition process, such as an atomic layer deposition (ALD) process, a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, or another applicable process, in accordance with some embodiments.

Figure 2A:
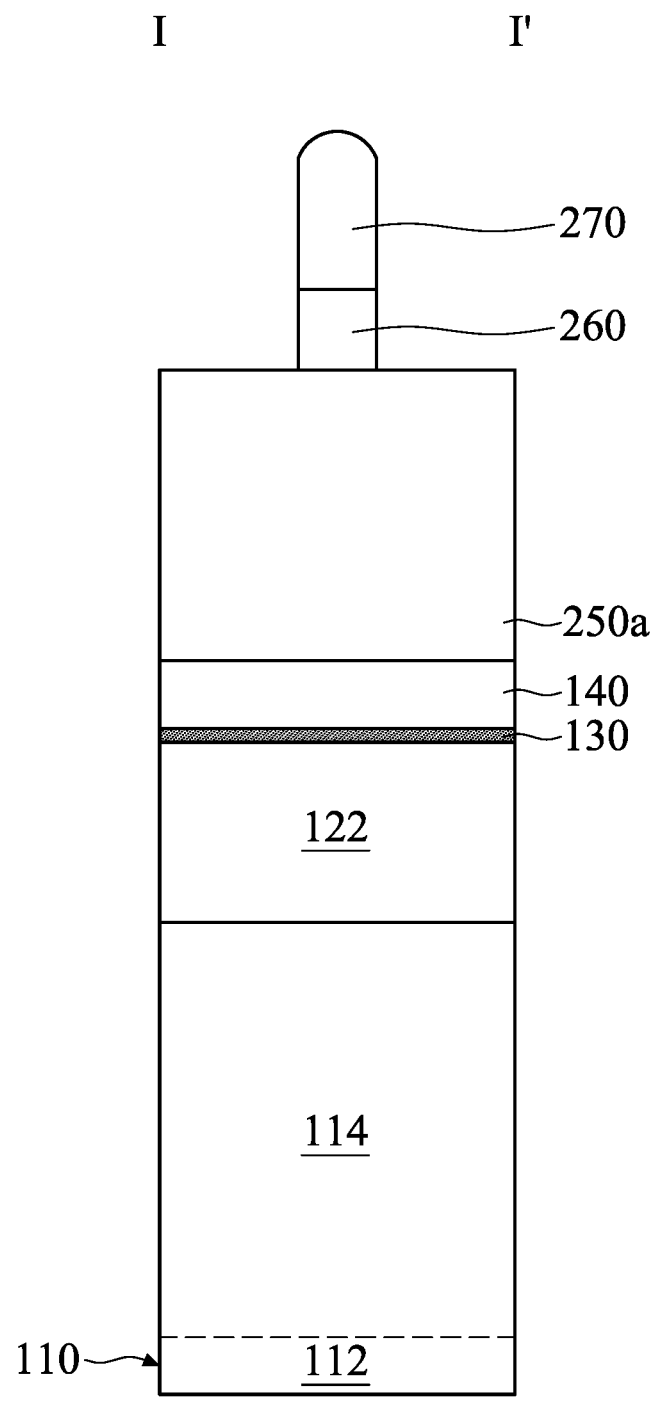
FIGS. 2A-2J are cross-sectional views of various stages of a process for forming a semiconductor device structure, in accordance with some embodiments.
Figures 1, 2A:
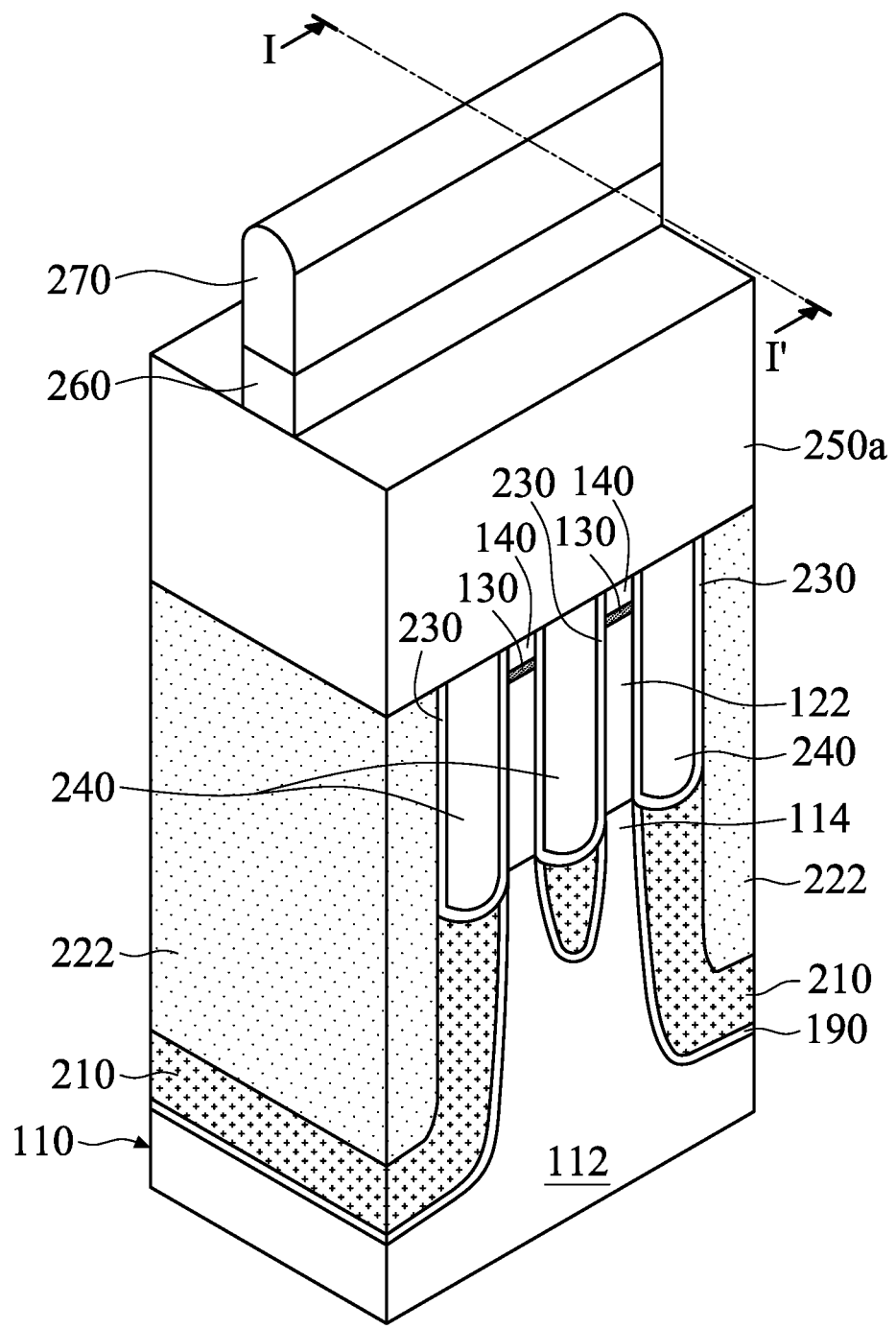

FIGS. 2A-2J are cross-sectional views of various stages of a process for forming a semiconductor device structure, in accordance with some embodiments. FIG. 2A-1 is a perspective view of the semiconductor device structure of FIG. 2A, in accordance with some embodiments. FIG. 2A is a cross-sectional view illustrating the semiconductor device structure along a sectional line I-I' in FIG. 2A-1, in accordance with some embodiments.

As shown in FIGS. 2A and 2A-1, mask layers 260 and 270 are sequentially formed over the gate layer 250a, in accordance with some embodiments. The mask layer 260 exposes a portion of the gate layer 250a, in accordance with some embodiments. In some embodiments, the mask layer 260 serves a buffer layer or an adhesive layer that is formed between the underlying gate layer 250a and the overlying mask layer 270. The mask layer 260 may also be used as an etch stop layer when the mask layer 270 is removed or etched.

In some embodiments, the mask layer 260 is made of silicon oxide. In some embodiments, the mask layer 260 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the mask layer 270 is made of silicon oxide, silicon nitride, silicon oxynitride, or another applicable material. In some embodiments, the mask layer 270 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

Figure 2B:
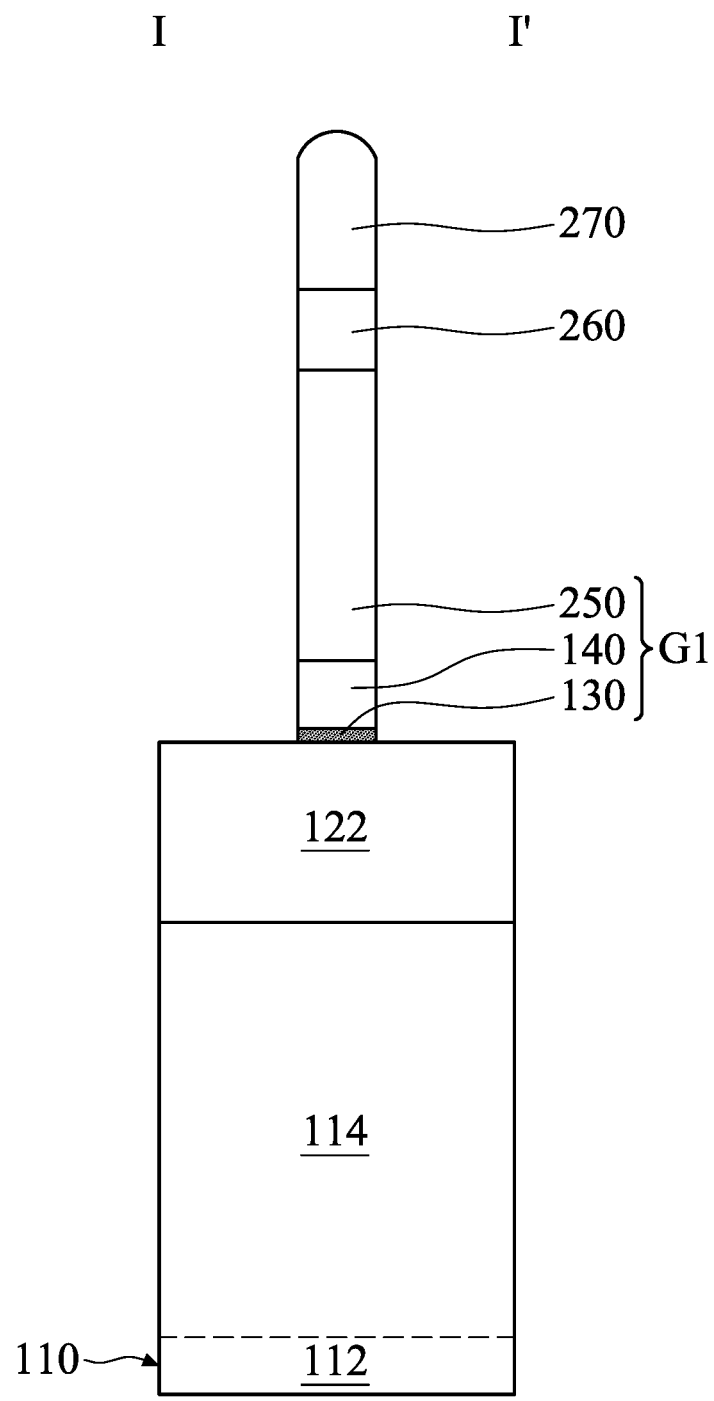
Figures 1, 2B:
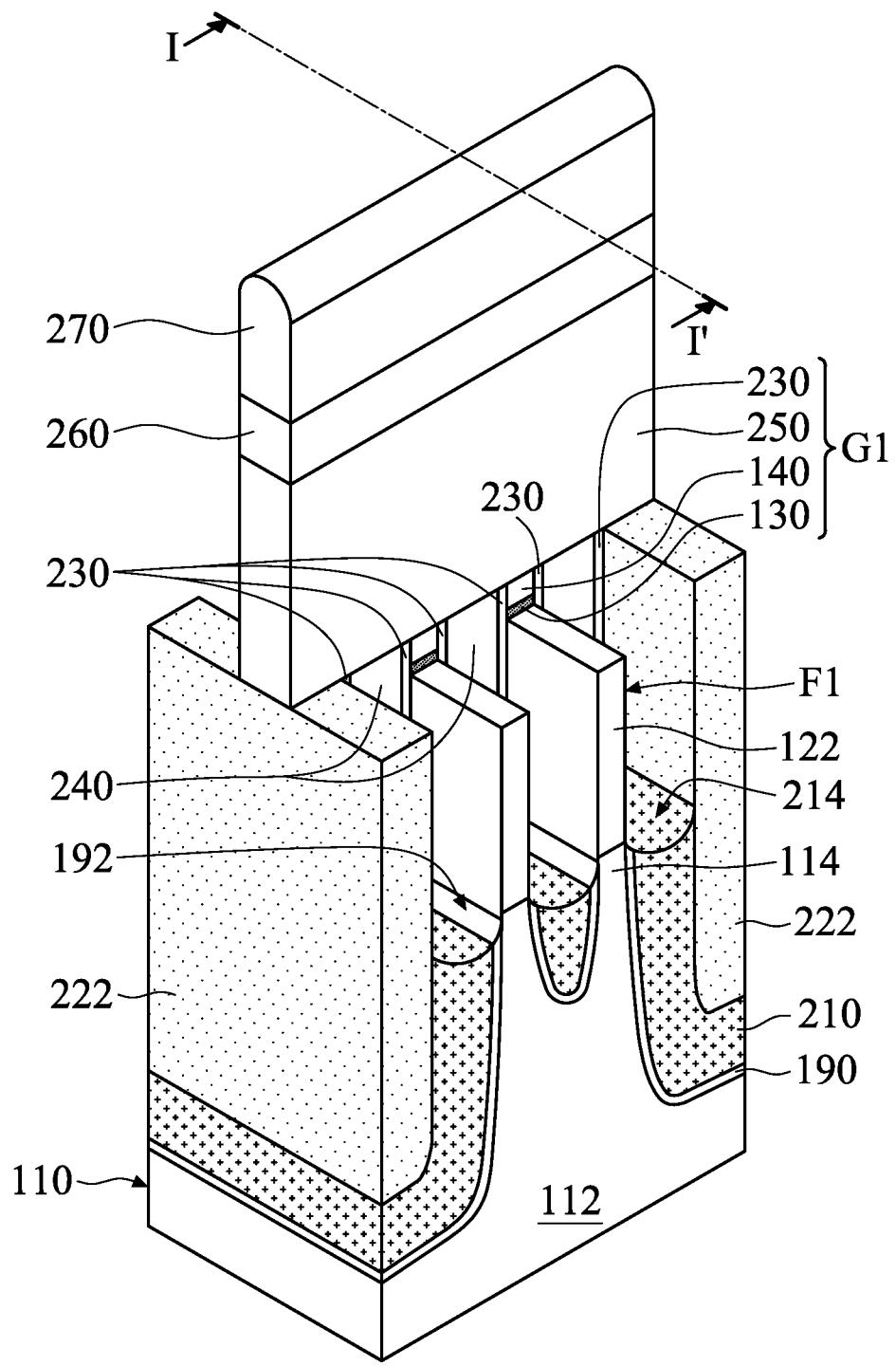

FIG. 2B-1 is a perspective view of the semiconductor device structure of FIG. 2B, in accordance with some embodiments. FIG. 2B is a cross-sectional view illustrating the semiconductor device structure along a sectional line I-I' in FIG. 2B-1, in accordance with some embodiments.

As shown in FIGS. 2A-1, 2B and 2B-1, the portion of the gate layer 250a exposed by the mask layers 260 and 270 is removed, in accordance with some embodiments. The remaining gate layer 250a forms a gate 250, in accordance with some embodiments. The gate 250 exposes portions of the semiconductor layer 140, the gate dielectric layer 230, and the semiconductor structure 240, in accordance with some embodiments.

The removal process includes an etching process, such as an anisotropic etching process, in accordance with some embodiments. The anisotropic etching process includes a dry etching process, such as a plasma etching process, a reactive ion etching (RIE) process, a neutral beam etching (NBE) process, the like, or a combination thereof, in accordance with some embodiments.

As shown in FIGS. 2A-1, 2B and 2B-1, the portions of the semiconductor layer 140, the gate dielectric layer 230, and the semiconductor structure 240 exposed by the gate 250 are removed, in accordance with some embodiments. As shown in FIGS. 2A-1, 2B and 2B-1, a portion of the adhesive layer 130 originally under the removed portions of the semiconductor layer 140 is removed, in accordance with some embodiments. After the removal process, the gate 250, the semiconductor layer 140, the gate dielectric layer 230, and the adhesive layer 130 together form a gate stack G1, in accordance with some embodiments.

The removal process includes an etching process, such as an anisotropic etching process, in accordance with some embodiments. The anisotropic etching process includes a dry etching process, such as a plasma etching process, a reactive ion etching (RIE) process, a neutral beam etching (NBE) process, the like, or a combination thereof, in accordance with some embodiments.

Figure 2C:
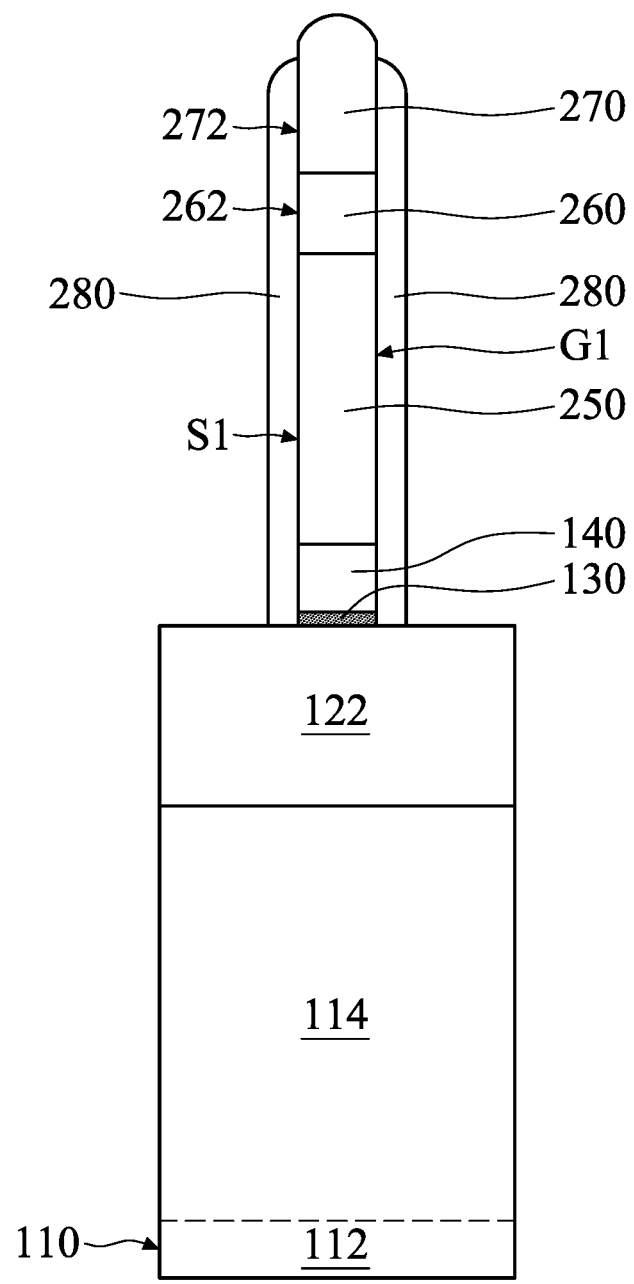

As shown in FIGS. 2B-1 and 2C, a spacer layer 280 is formed over sidewalls S1 of the gate stack G1 and sidewalls 262 and 272 of the mask layers 260 and 270, and the top surfaces 214 and 192 of the dielectric layer 210 and the liner layer 190, in accordance with some embodiments. The spacer layer 280 is a single-layered structure or a multi-layered structure, in accordance with some embodiments.

The spacer layer 280 is made of an insulating material, such as silicon nitride, silicon oxide, silicon carbide, silicon oxynitride, or another applicable insulating material. The spacer layer 280 is formed using a deposition process and an etching process, in accordance with some embodiments. The deposition process includes a chemical vapor deposition (CVD) process, an atomic layer deposition (ALD) process, or a physical vapor deposition (PVD) process, in accordance with some embodiments.

Figure 2D:
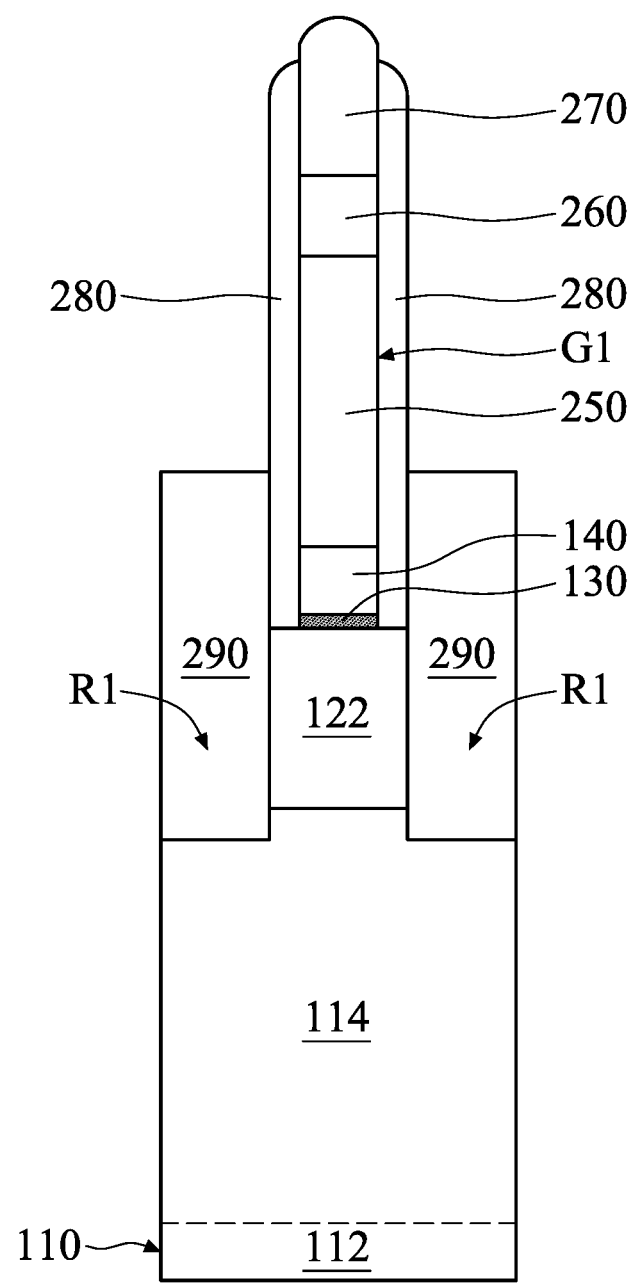

As shown in FIG. 2D, the fins 122 and the fin portions 114 of the substrate 110 are partially removed, in accordance with some embodiments. After the removal process, as shown in FIG. 2D, recesses R1 are formed in the fins 122 and the fin portions 114 of the substrate 110, in accordance with some embodiments.

The recesses R1 are configured to accommodate source/drain structures formed in a subsequent process, in accordance with some embodiments. The removal process includes an etching process, such as an anisotropic etching process (e.g., a dry etching process), in accordance with some embodiments.

As shown in FIG. 2D, source/drain structures 290 are respectively formed in the recesses R1, in accordance with some embodiments. The source/drain structures 290 are in direct contact with the fins 122 and the fin portions 114 of the substrate 110, in accordance with some embodiments.

The source/drain structures 290 are positioned on two opposite sides of the gate stack G1, in accordance with some embodiments. The source/drain structures 290 include a source structure and a drain structure, in accordance with some embodiments.

The source/drain structures 290 are made of an N-type conductivity material, in accordance with some embodiments. The N-type conductivity material includes silicon phosphorus (SiP) or another suitable N-type conductivity material. The source/drain structures 290 are formed using an epitaxial process, in accordance with some embodiments.

The source/drain structures 290 are doped with the Group VA element, in accordance with some embodiments. The Group VA element includes phosphor (P), antimony (Sb), or another suitable Group VA material. The source/drain structures 290 are also referred to as doped structures, in accordance with some embodiments.

In some other embodiments, the source/drain structures 290 are made of a P-type conductivity material, in accordance with some embodiments. The P-type conductivity material includes silicon germanium (SiGe) or another suitable P-type conductivity material. The source/drain structures 290 are formed using an epitaxial process, in accordance with some embodiments. The source/drain structures 290 are doped with the Group IIIA element, in accordance with some embodiments. The Group IIIA element includes boron or another suitable material.

Figure 2E:
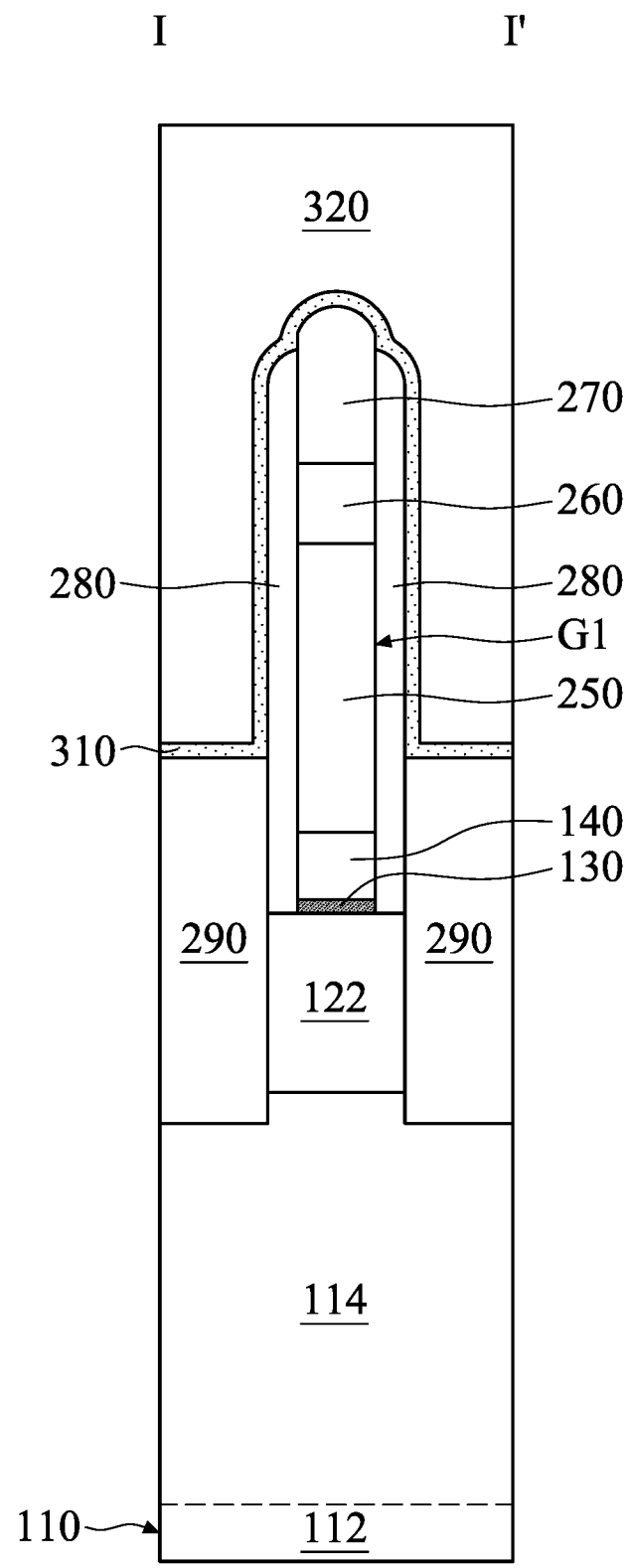
Figures 1, 2E:
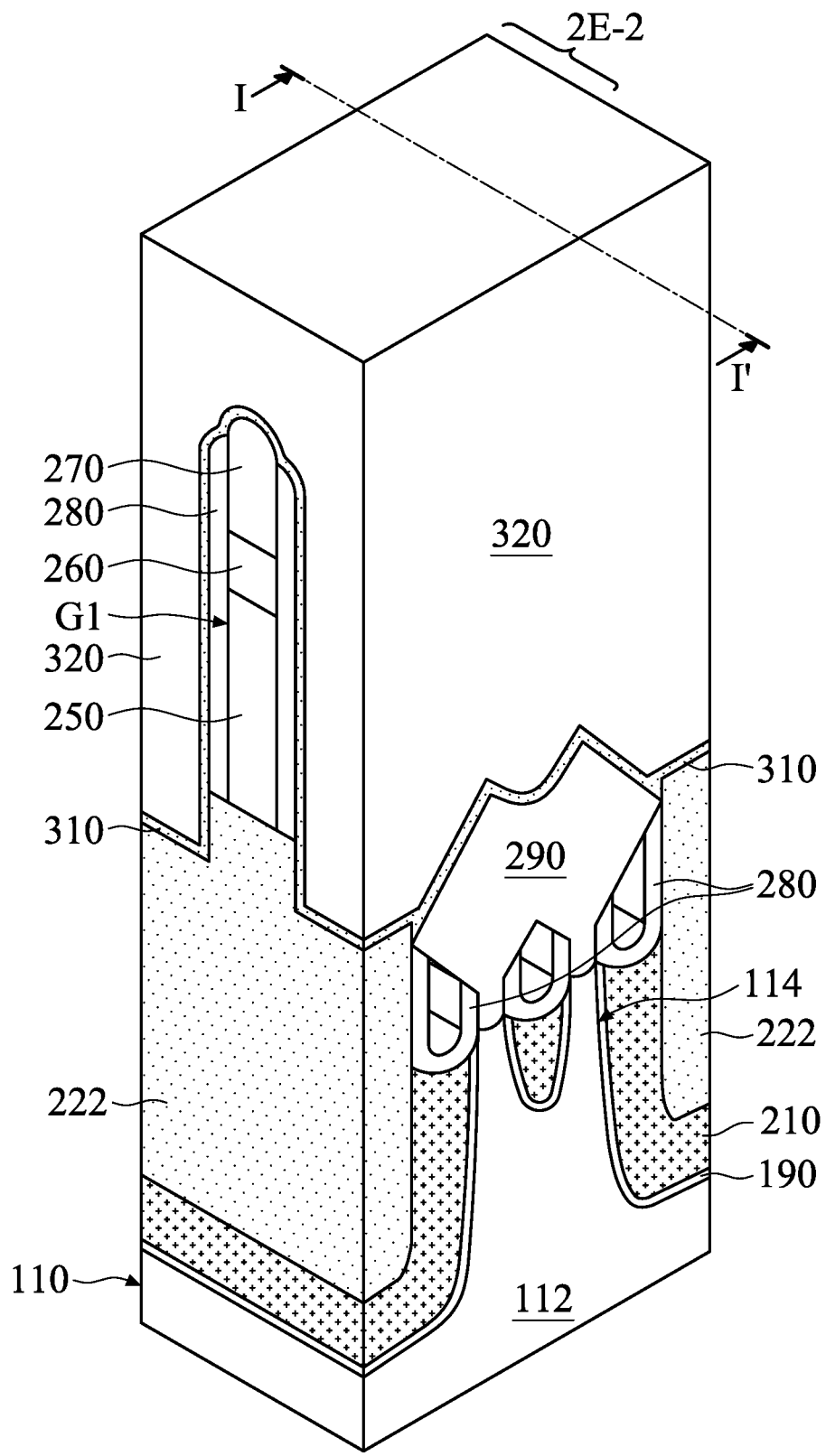
Figures 2, 2E:
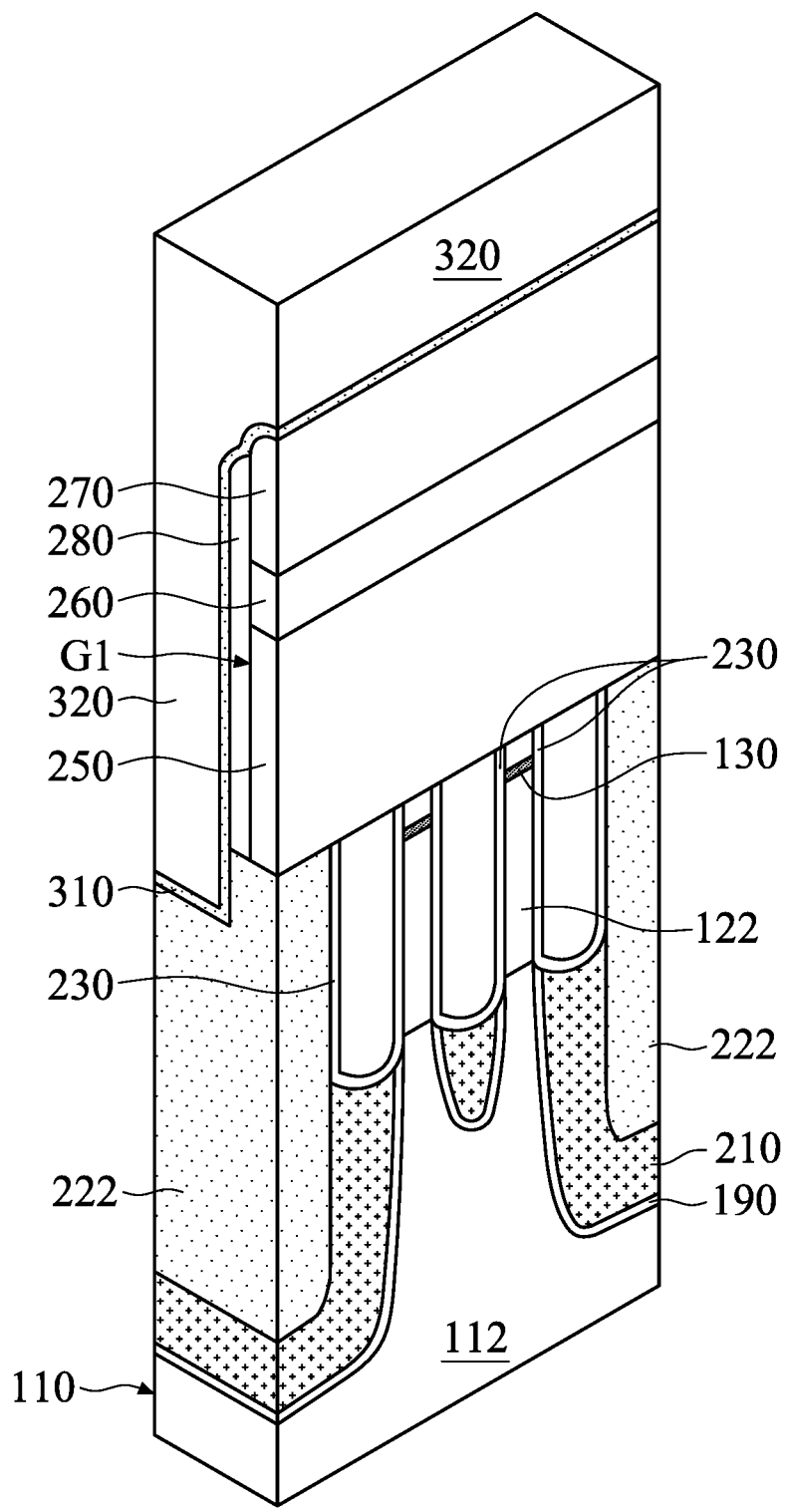

FIG. 2E-1 is a perspective view of the semiconductor device structure of FIG. 2E, in accordance with some embodiments. FIG. 2E is a cross-sectional view illustrating the semiconductor device structure along a sectional line I-I' in FIG. 2E-1, in accordance with some embodiments. FIG. 2E-2 is a perspective view of a portion 2E-2 of the semiconductor device structure of FIG. 2E-1, in accordance with some embodiments.

As shown in FIGS. 2E, 2E-1, and 2E-2, an etch stop layer 310 is conformally formed over the source/drain structures 290, the dummy fins 222, the spacer layer 280, and the mask layer 270, in accordance with some embodiments. The etch stop layer 310 is made of an insulating material, such as a nitrogen-containing material (e.g., silicon nitride), in accordance with some embodiments.

The etch stop layer 310 is formed using a deposition process, such as a chemical vapor deposition (CVD) process, an atomic layer deposition (ALD) process, or a physical vapor deposition (PVD) process, in accordance with some embodiments.

As shown in FIGS. 2E, 2E-1, and 2E-2, a dielectric layer 320 is formed over the etch stop layer 310, in accordance with some embodiments. The dielectric layer 320 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. The dielectric layer 320 is formed using any suitable process, such as a CVD process, a spin-on process, or a combination thereof, in accordance with some embodiments.

Figure 2F:
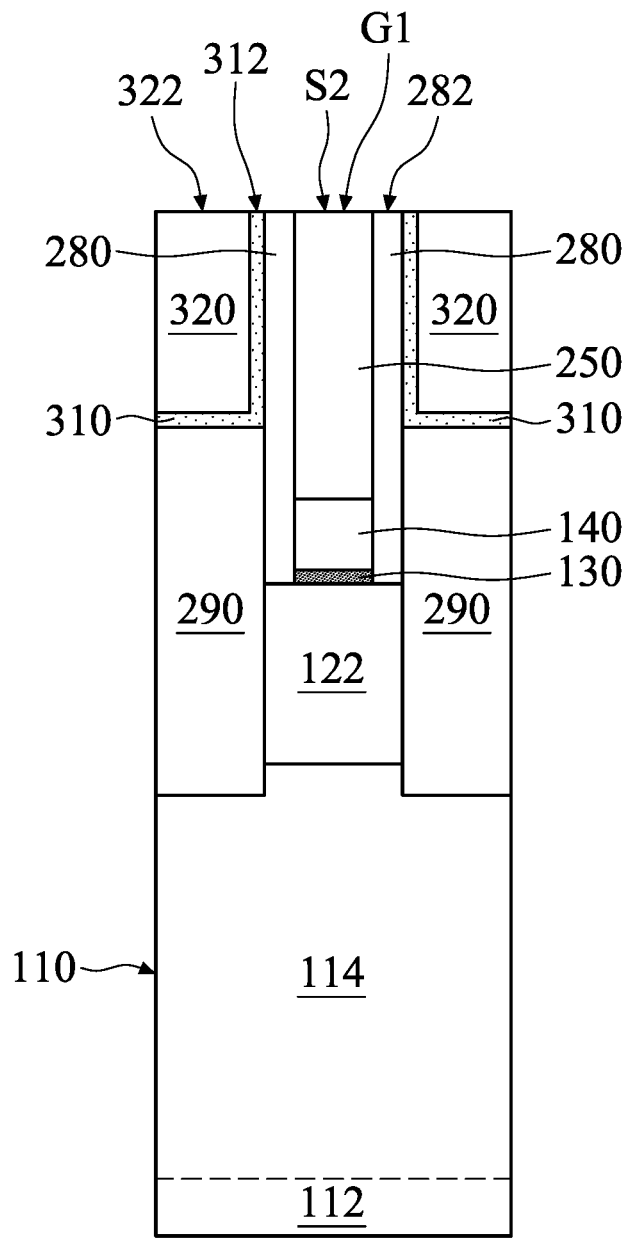

Afterwards, as shown in FIG. 2F, the mask layers 260 and 270 and upper portions of the dielectric layer 320 and the etch stop layer 310 are removed, in accordance with some embodiments. The removal process includes performing a planarization process over the dielectric layer 320 until a top surface S2 of the gate stack G1 is exposed, in accordance with some embodiments.

Figure 2G:
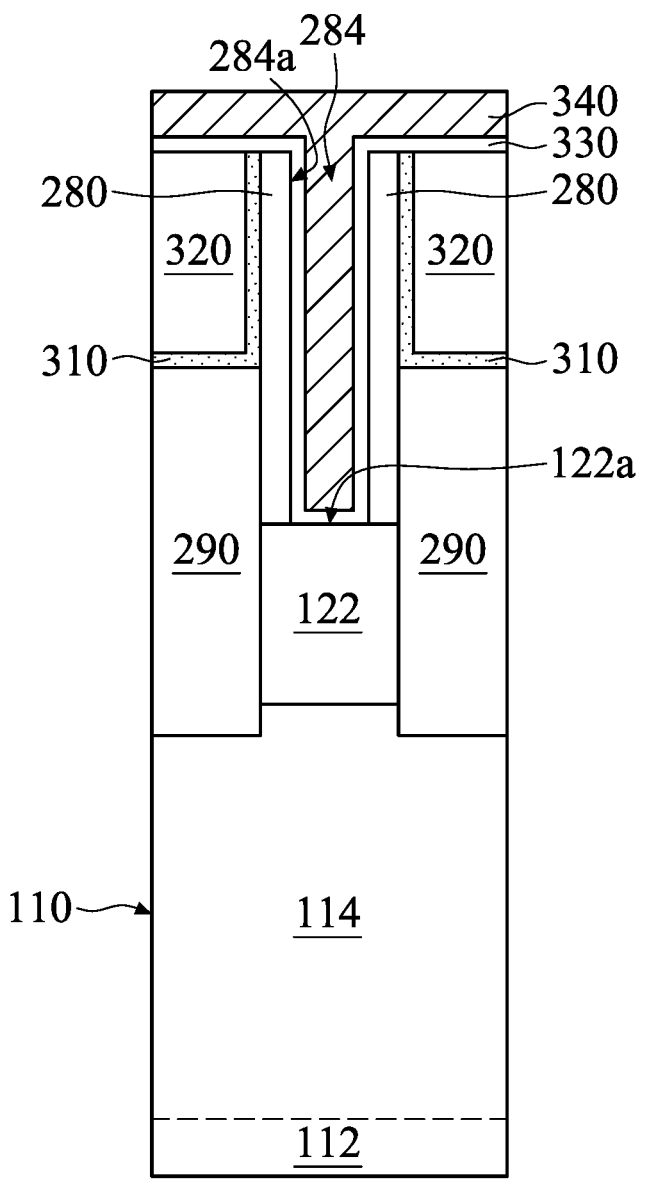
Figure 2H:
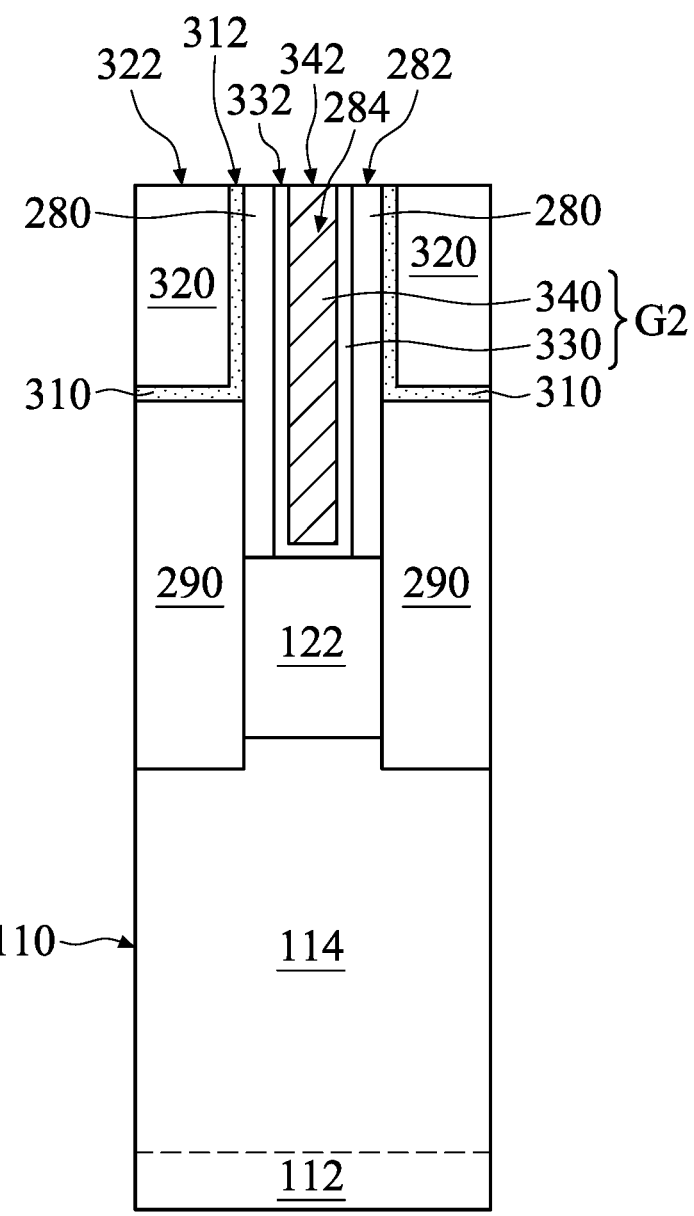
Figures 1, 2H:
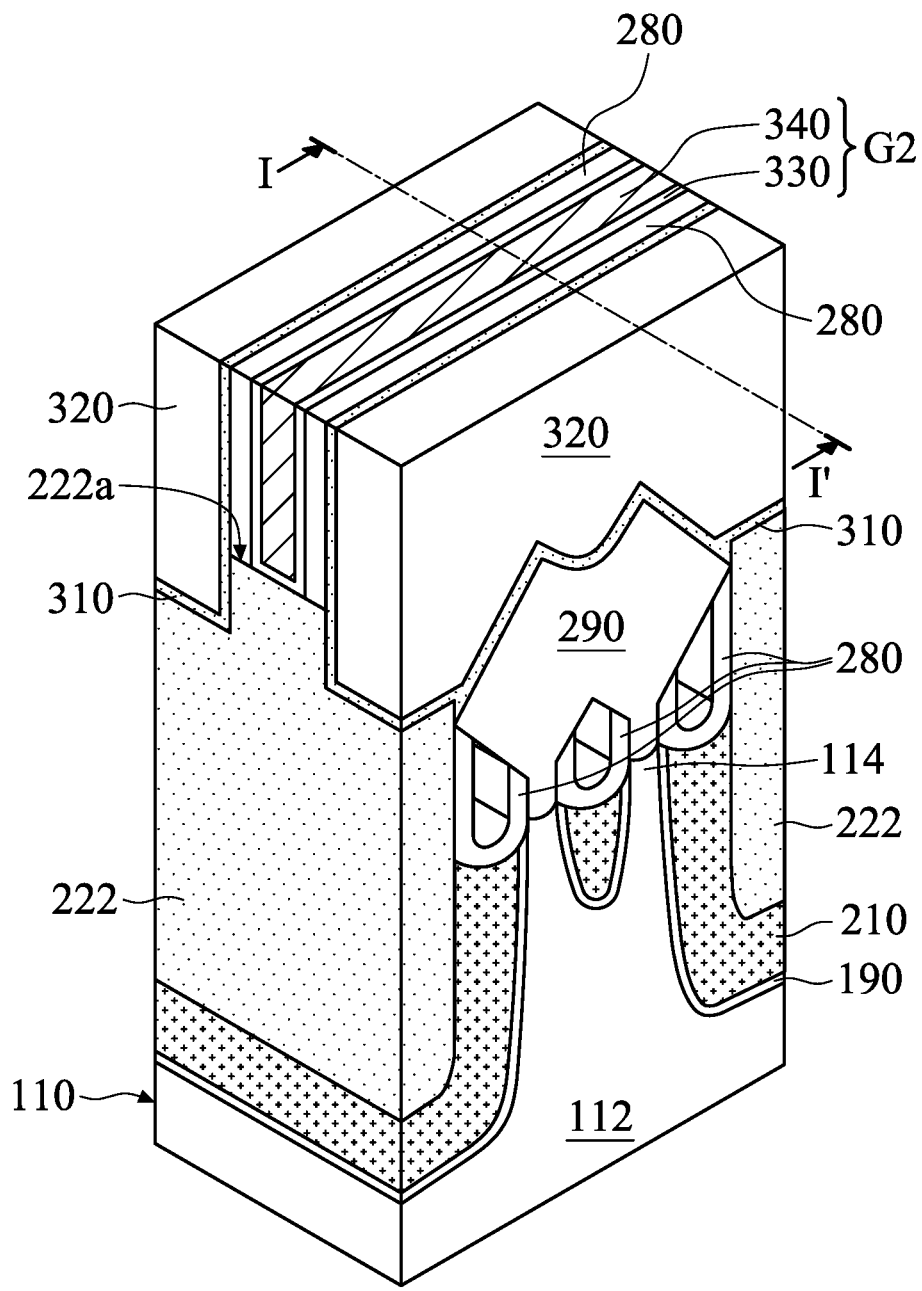

Thereafter, a gate replacement process is performed, in accordance with some embodiments. For example, the gate replacement process is shown in FIGS. 2G and 2H. As shown in FIG. 2G, the gate stack G1 and the is removed, in accordance with some embodiments. The spacer layer 280 has a trench 284, in accordance with some embodiments. The trench 284 exposes the fin 122, in accordance with some embodiments.

As shown in FIG. 2G, a gate dielectric layer 330 is conformally formed over the dielectric layer 320 and in the trench 284, in accordance with some embodiments. The gate dielectric layer 330 is made of a dielectric material, such as a high dielectric constant (high-k) material, in accordance with some embodiments.

The high-k material is made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof, in accordance with some embodiments.

In some embodiments, the high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or combinations thereof.

In some embodiments, the gate dielectric layer 330 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, or another applicable process.

As shown in FIG. 2G, a gate electrode layer 340 is formed over the gate dielectric layer 330, in accordance with some embodiments. The gate electrode layer 340 is also referred to as a work function metal layer, in accordance with some embodiments. The gate electrode layer 340 provides a desired work function for transistors to enhance device performance including improved threshold voltage.

In the embodiments of forming an NMOS transistor, the gate electrode layer 340 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In the embodiments of forming a PMOS transistor, the gate electrode layer 340 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or a combination thereof.

The gate electrode layer 340 is made of a suitable metal material, such as aluminum, tungsten, gold, platinum, cobalt, another suitable metal, an alloy thereof, or a combination thereof, in accordance with some embodiments. The gate electrode layer 340 is formed using a deposition process (or a plating process) and a planarization process, in accordance with some embodiments. The deposition process includes a physical vapor deposition (PVD) process, a CVD process, an atomic layer deposition (ALD), another suitable method, or a combination thereof.

FIG. 2H-1 is a perspective view of the semiconductor device structure of FIG. 2H, in accordance with some embodiments. FIG. 2H is a cross-sectional view illustrating the semiconductor device structure along a sectional line I-I' in FIG. 2H-1, in accordance with some embodiments.

As shown in FIGS. 2H and 2H-1, a planarization process is performed to remove portions of the gate electrode layer 340 and the gate dielectric layer 330 outside of the trench 284, in accordance with some embodiments. As shown in FIG. 2H, the gate electrode layer 340 and the gate dielectric layer 330 remaining in the trench 284 together form a gate stack G2, in accordance with some embodiments. As shown in FIG. 2H-1, the spacer layer 280 extends onto the top surfaces 222a of the dummy fins 222, in accordance with some embodiments.

Figure 2I:
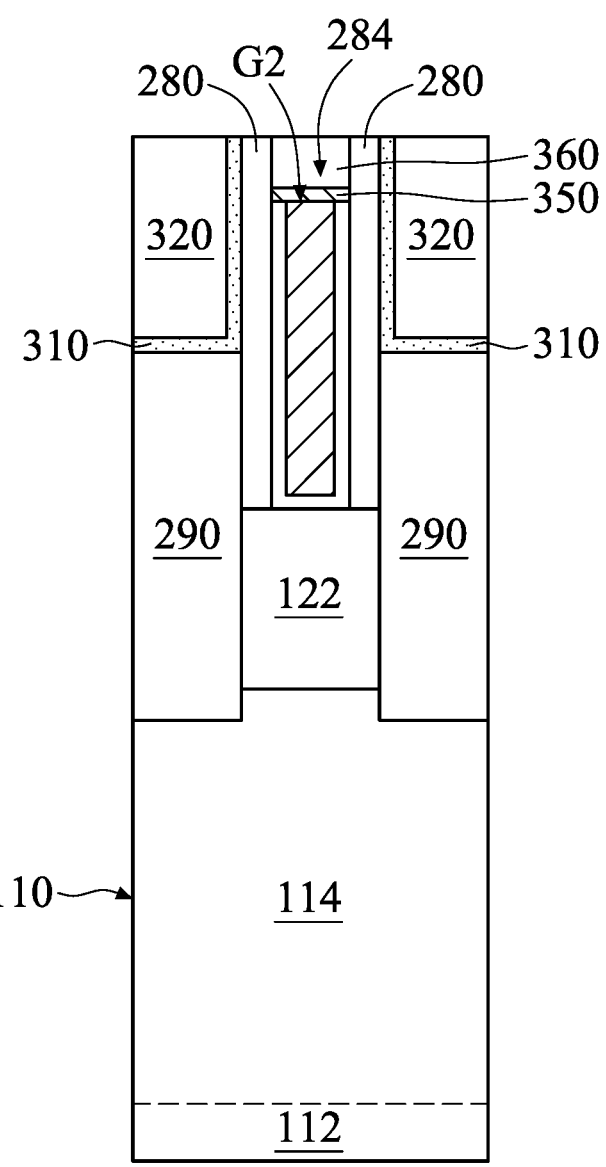
Figures 1, 2I:
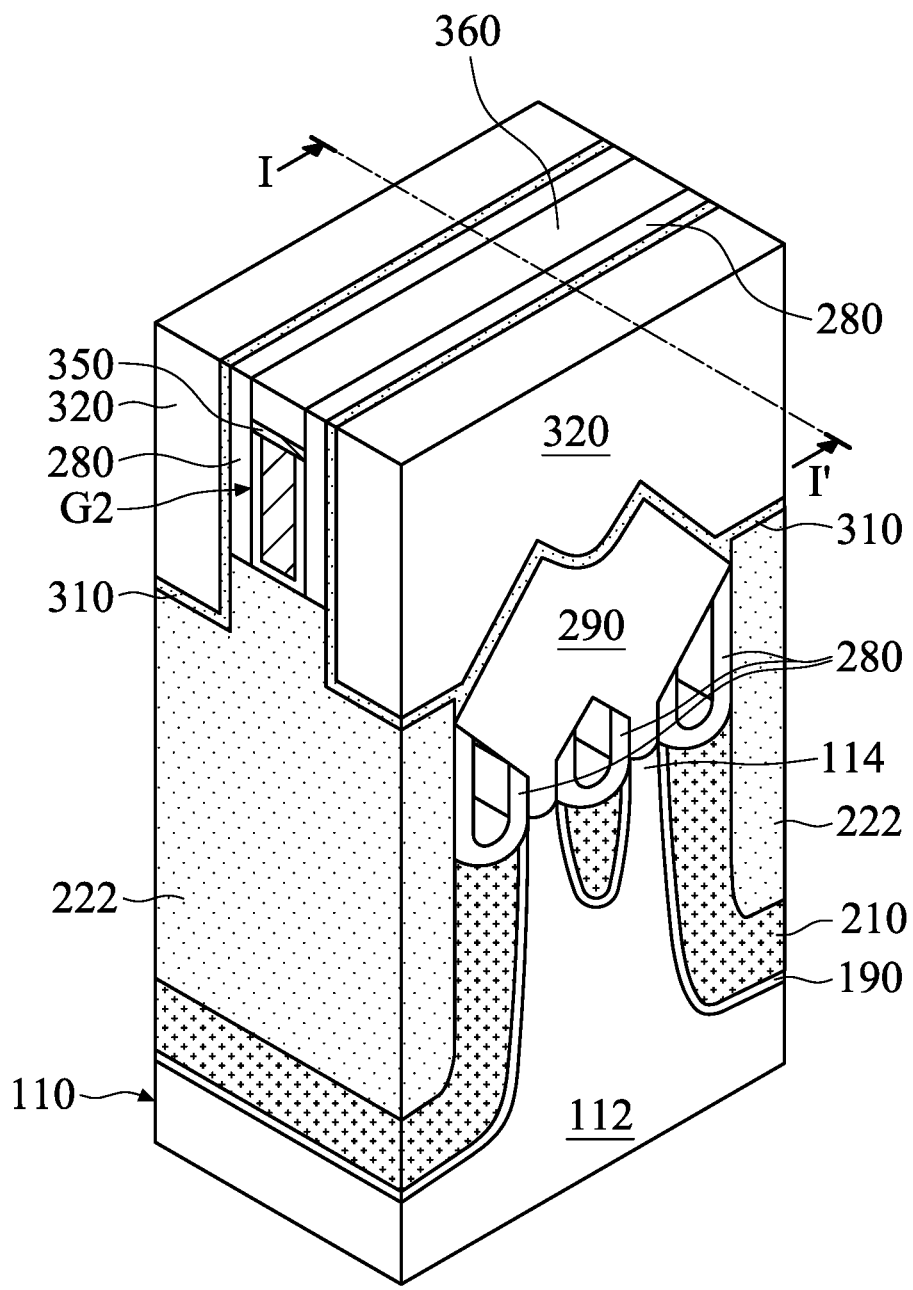

FIG. 2I-1 is a perspective view of the semiconductor device structure of FIG. 2I, in accordance with some embodiments. FIG. 2I is a cross-sectional view illustrating the semiconductor device structure along a sectional line I-I' in FIG. 2I-1, in accordance with some embodiments.

As shown in FIGS. 2I and 2I-1, a conductive layer 350 is formed over the gate electrode layer 340, in accordance with some embodiments. The conductive layer 350 is also called a metal gate electrode layer, in accordance with some embodiments. The conductive layer 350 is made of a suitable metal material, such as aluminum, tungsten, gold, platinum, cobalt, other suitable metal, an alloy thereof, or a combination thereof, in accordance with some embodiments.

As shown in FIGS. 2I and 2I-1, a cap layer 360 is formed in the trench 284 of the spacer layer 280 and over the conductive layer 350, in accordance with some embodiments. The cap layer 360 is made of nitrides (SiN or SiON), in accordance with some embodiments.

The cap layer 360 is formed using a deposition process and a planarization process, in accordance with some embodiments. The deposition process includes a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, an atomic layer deposition (ALD) process, or a physical vapor deposition (PVD) process, in accordance with some embodiments.

Figure 2J:
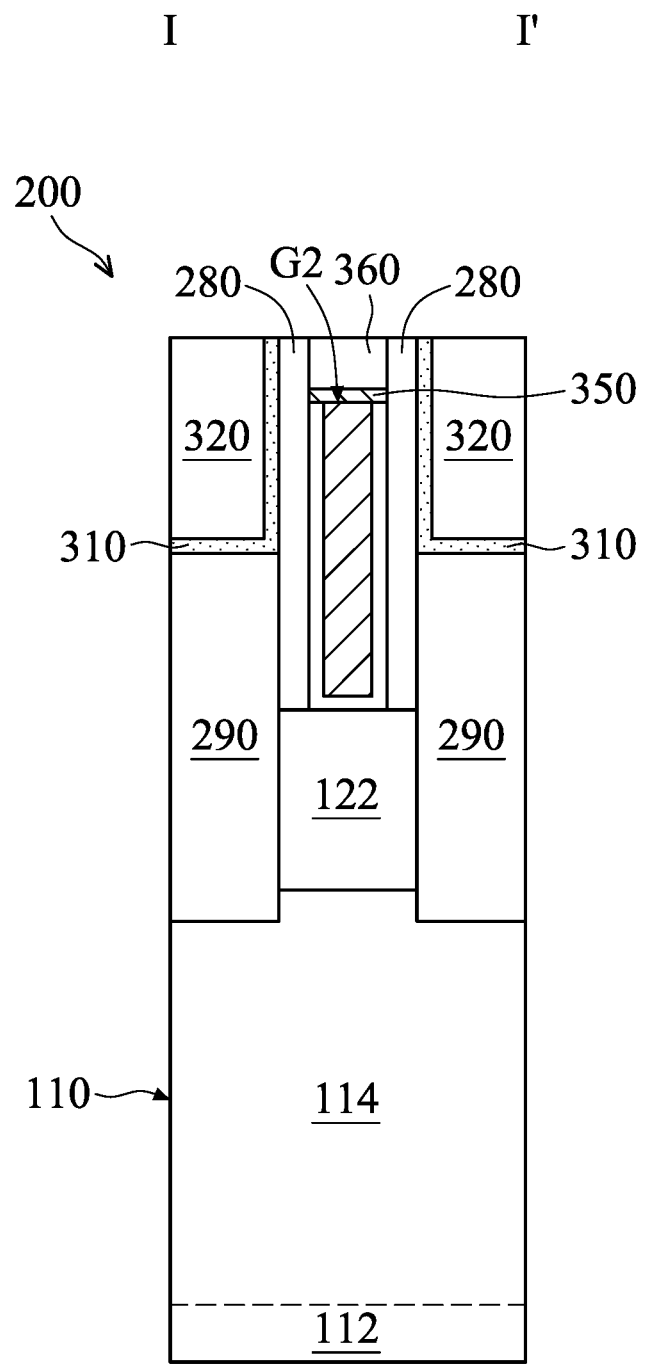
Figures 1, 2J:
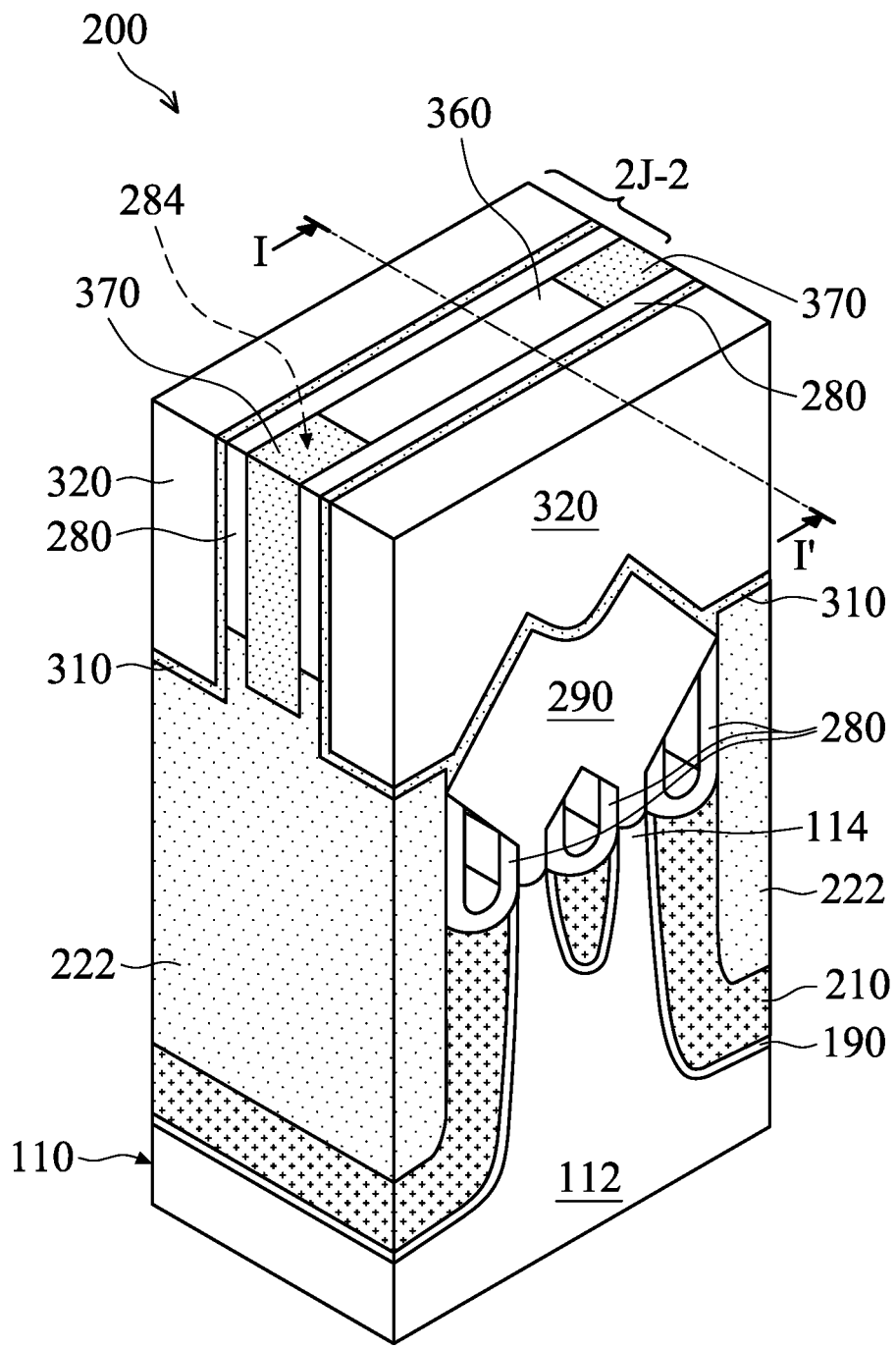
Figures 2, 2J:
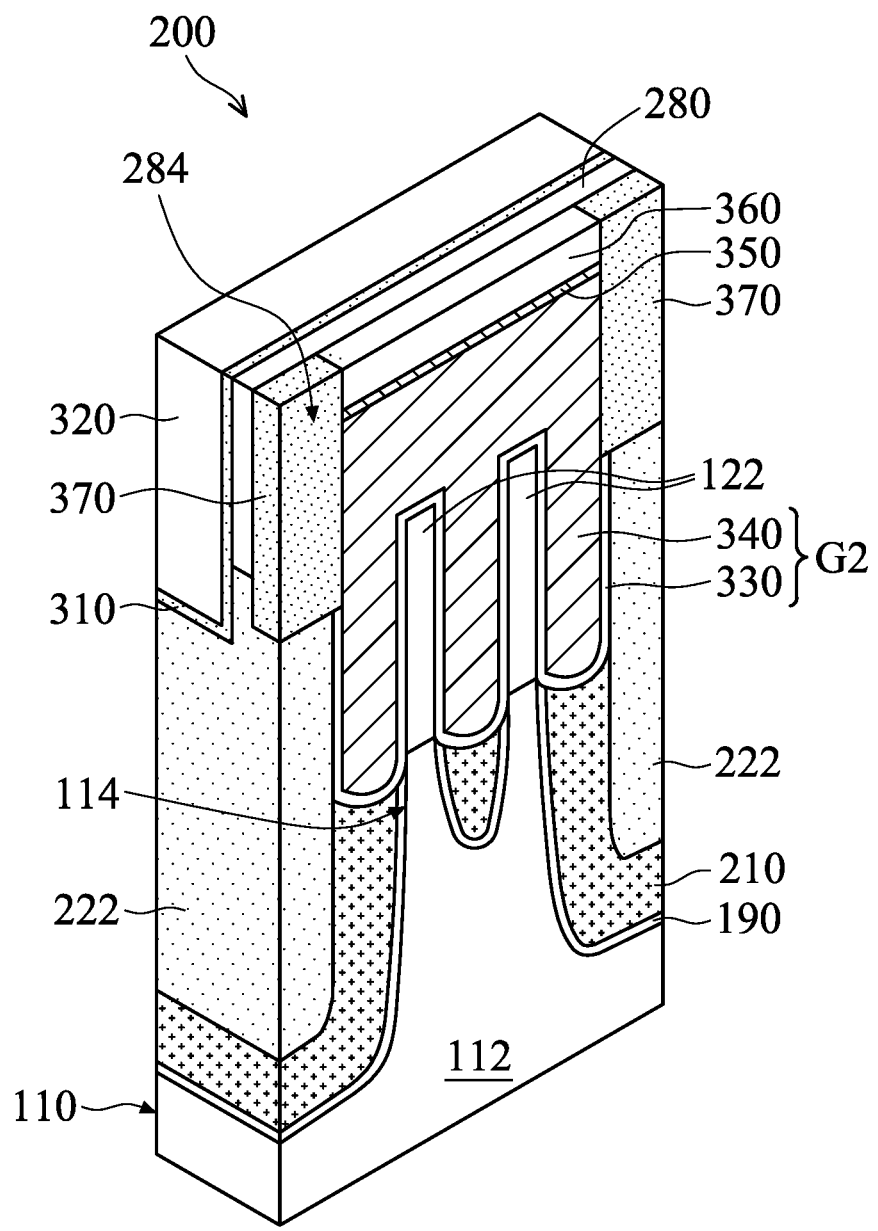

FIG. 2J-1 is a perspective view of the semiconductor device structure of FIG. 2J, in accordance with some embodiments. FIG. 2J is a cross-sectional view illustrating the semiconductor device structure along a sectional line I-I' in FIG. 2J-1, in accordance with some embodiments. FIG. 2J-2 is a perspective view of a portion 2J-2 of the semiconductor device structure of FIG. 2J-1, in accordance with some embodiments.

As shown in FIGS. 2J, 2J-1, and 2J-2, portions of the cap layer 360, the conductive layer 350, and the gate stack G2 are removed, in accordance with some embodiments. The removal process includes an etching process, such as an anisotropic etching process, in accordance with some embodiments. The anisotropic etching process includes a dry etching process, such as a plasma etching process, a reactive ion etching (RIE) process, a neutral beam etching (NBE) process, the like, or a combination thereof, in accordance with some embodiments.

As shown in FIGS. 2J, 2J-1, and 2J-2, a gate cut structure 370 is formed in the trench 284 of the spacer layer 280 to cut off the gate stack G2, in accordance with some embodiments. The gate cut structure 370 is made of oxides (e.g., $SiO_2$ or SiON) or nitrides (SiN), in accordance with some embodiments.

The gate cut structure 370 is formed using a deposition process and a planarization process, in accordance with some embodiments. The deposition process includes a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, an atomic layer deposition (ALD) process, or a physical vapor deposition (PVD) process, in accordance with some embodiments.

As shown in FIG. 2J-2, the gate stack G2 is wrapped around the fins 122 and adjacent to the dummy fins 222, in accordance with some embodiments. In this step, a semiconductor device structure 200 is substantially formed, in accordance with some embodiments.

Figure 3A:
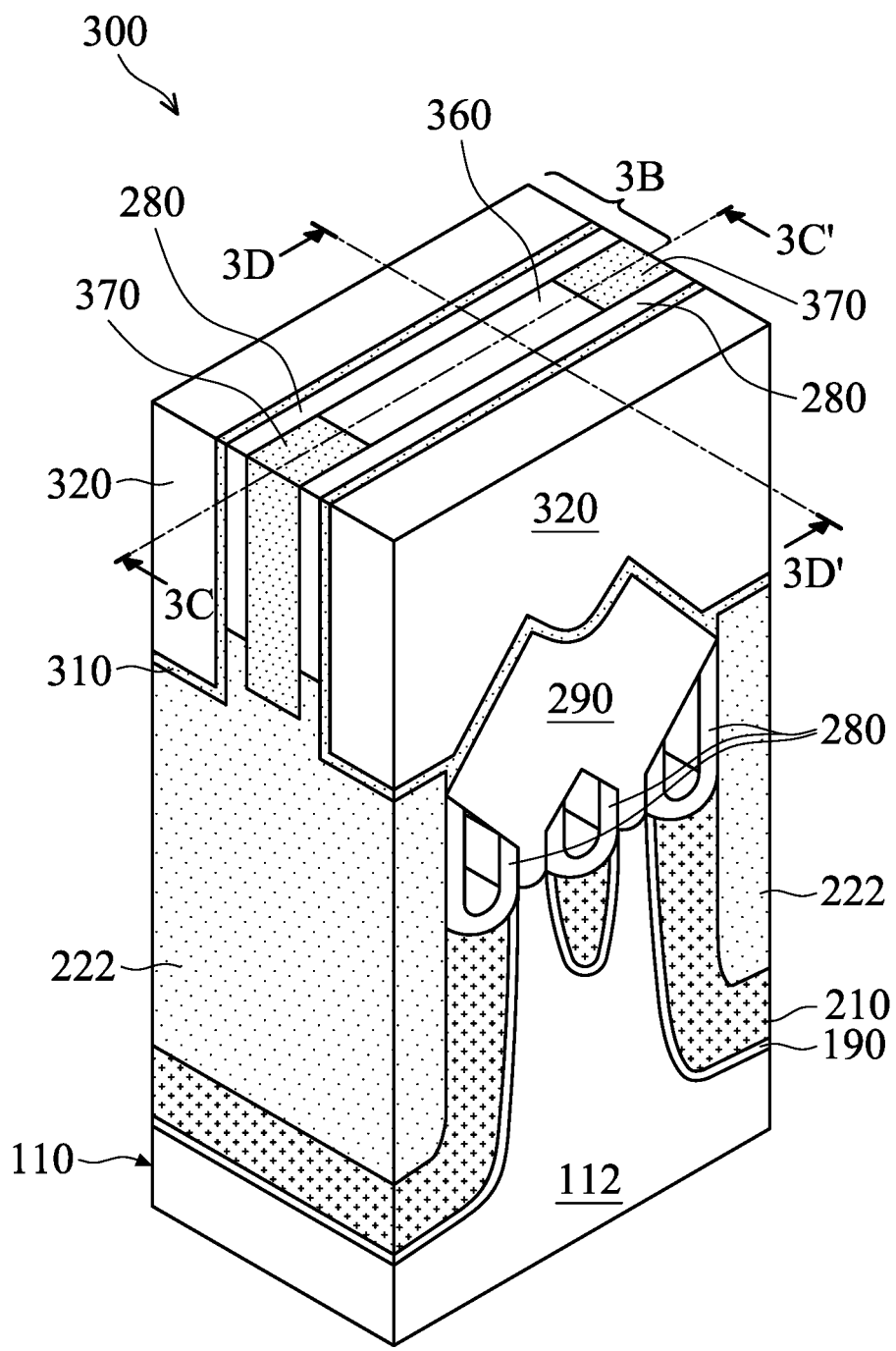
FIG. 3A is a perspective view of a semiconductor device structure, in accordance with some embodiments.
Figure 3B:
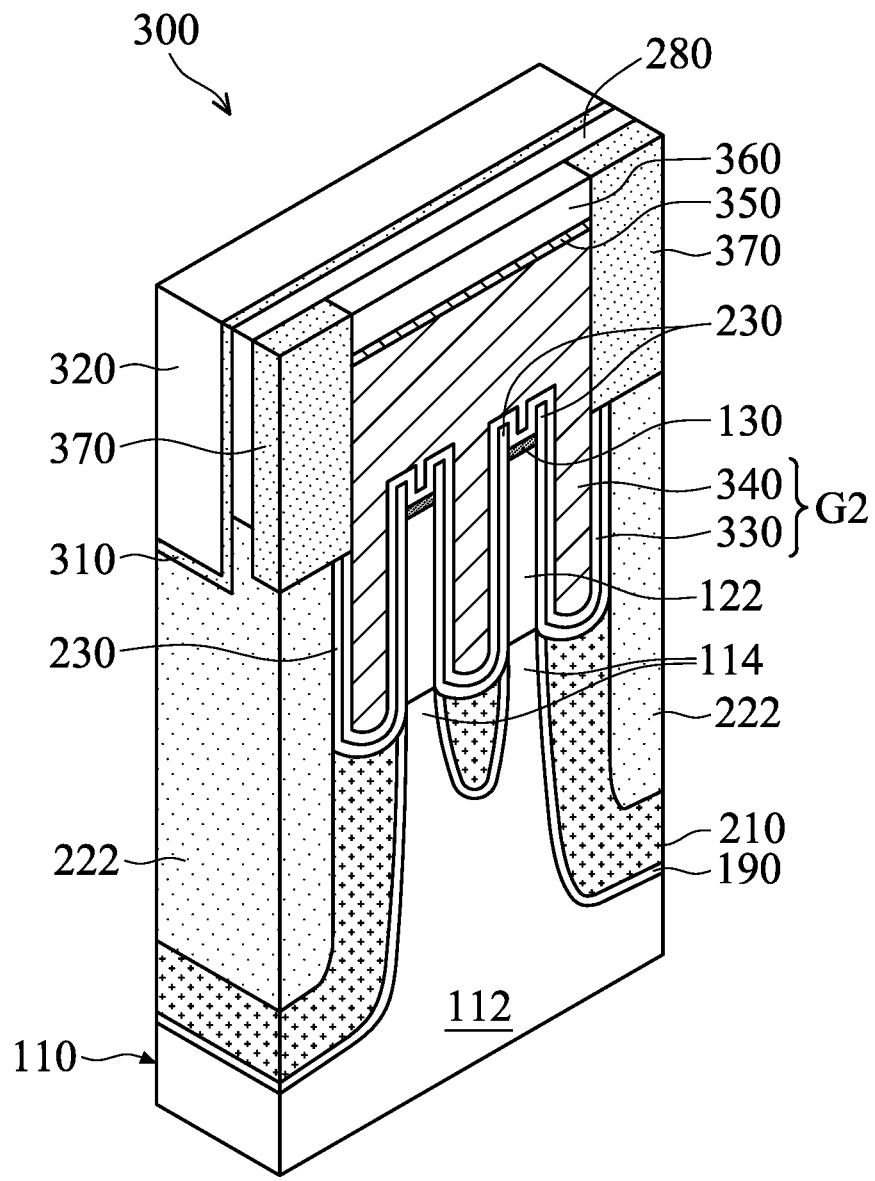
FIG. 3B is a perspective view of a portion of the semiconductor device structure of FIG. 3A, in accordance with some embodiments.
Figure 3C:
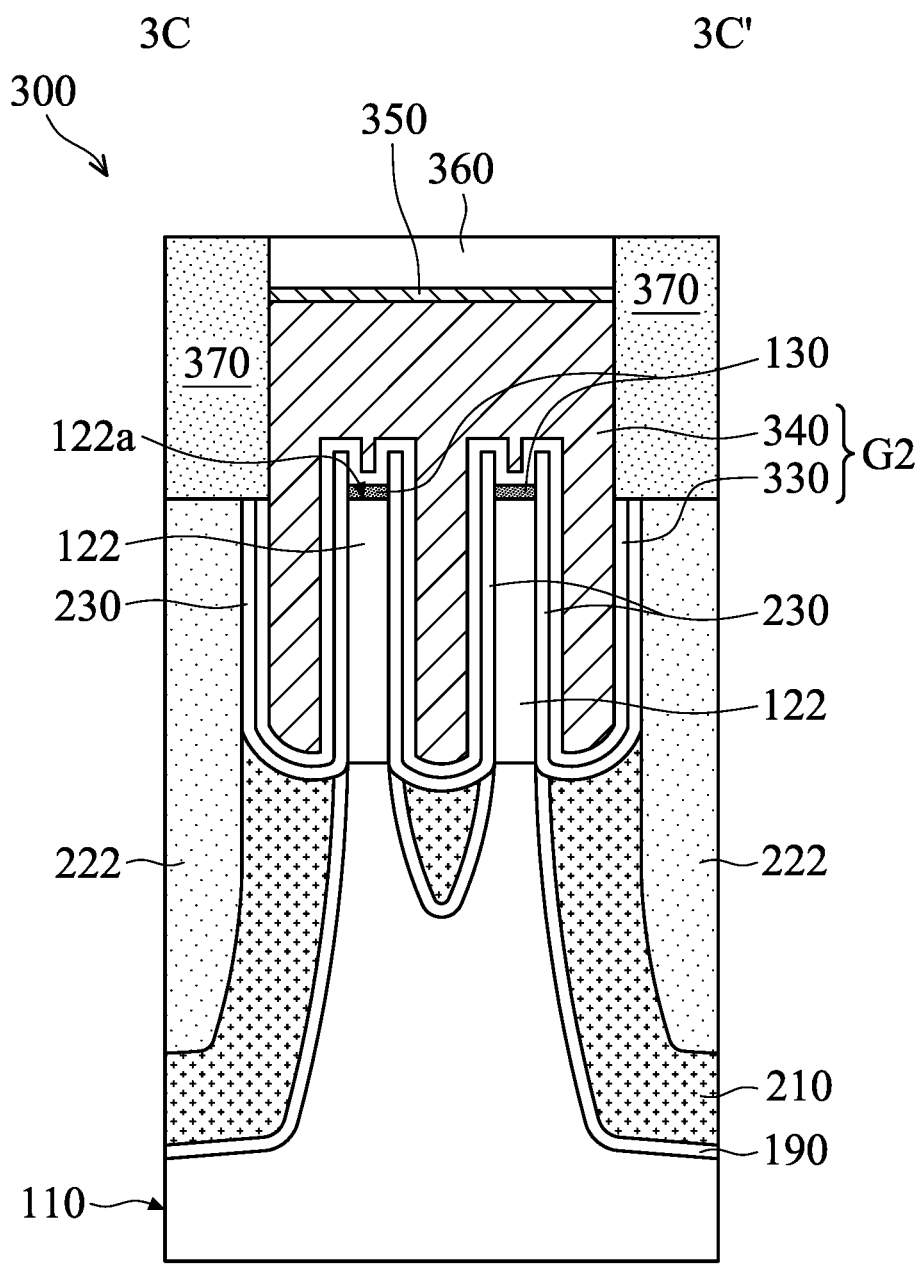
FIG. 3C is a cross-sectional view illustrating the semiconductor device structure along a sectional line 3C-3C' in FIG. 3A, in accordance with some embodiments.
Figure 3D:
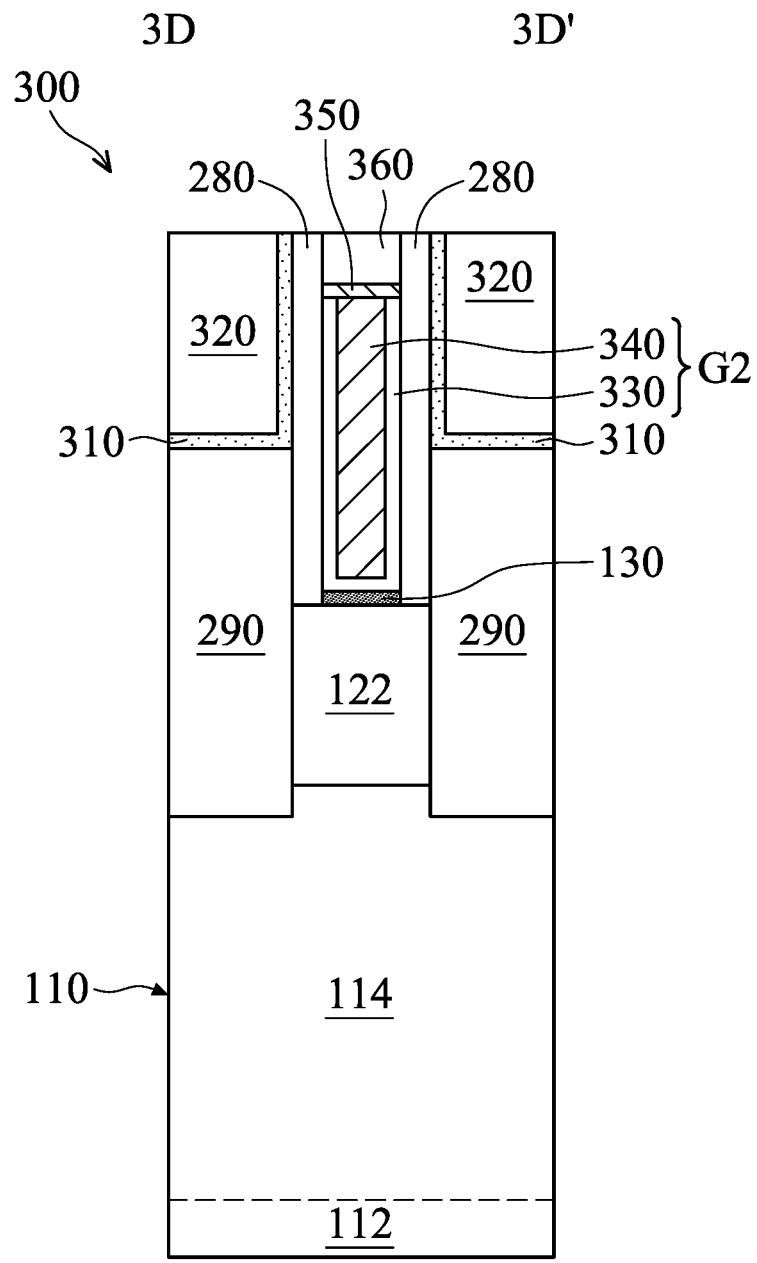
FIG. 3D is a cross-sectional view illustrating the semiconductor device structure along a sectional line 3D-3D' in FIG. 3A, in accordance with some embodiments.

FIG. 3A is a perspective view of a semiconductor device structure 300, in accordance with some embodiments. FIG. 3B is a perspective view of a portion 3B of the semiconductor device structure of FIG. 3A, in accordance with some embodiments. FIG. 3C is a cross-sectional view illustrating the semiconductor device structure along a sectional line 3C-3C' in FIG. 3A, in accordance with some embodiments. FIG. 3D is a cross-sectional view illustrating the semiconductor device structure along a sectional line 3D-3D' in FIG. 3A, in accordance with some embodiments.

As shown in FIGS. 3A, 3B, 3C, and 3D, after the step of FIG. 2F, the gate 250 and the semiconductor layer 140 are removed, in accordance with some embodiments. The adhesive layer 130 and the gate dielectric layer 230 are remained after the removal process, in accordance with some embodiments.

As shown in FIGS. 3A, 3B, 3C, and 3D, the steps of FIGS. 2G-2J are performed to form the gate stack G2, which includes the gate dielectric layer 330 and the gate electrode layer 340, the conductive layer 350, the cap layer 360, and the gate cut structure 370, in accordance with some embodiments. In this step, a semiconductor device structure 300 is substantially formed, in accordance with some embodiments.

The gate dielectric layer 330 conformally covers the gate dielectric layer 230 and the adhesive layer 130, in accordance with some embodiments. The gate dielectric layers 230 and 330 extend into the gate electrode layer 340, in accordance with some embodiments. As shown in FIG. 3C, the adhesive layer 130 and upper portions of the gate dielectric layer 230 together form an H-like structure, in accordance with some embodiments.

Processes and materials for forming the semiconductor structure 300 may be similar to, or the same as, those for forming the semiconductor structure 200 described above. Elements with structures and materials that are the same or similar to those in FIGS. 1A to 3D are designated by the same reference numbers as those in FIGS. 1A to 3D. Therefore, the detailed descriptions of said elements are not repeated herein.

In accordance with some embodiments, semiconductor device structures and methods for forming the same are provided. The methods (for forming the semiconductor device structure) form a semiconductor layer over a fin, which is formed over a substrate, to prevent the fin from wiggling or bending. The semiconductor layer and the substrate are made of the same material or similar materials. The semiconductor layer and the fin are made of different materials. Since the semiconductor layer and the substrate have the same lattice constant or similar lattice constants, the semiconductor layer is able to constrain the wiggling of the fin. The wiggling of the upper portion and the lower portion of the fins is constrained by the semiconductor layer and the substrate. Therefore, the yield of the fin is improved, which improves the yield of the semiconductor device structures with the fin.

In accordance with some embodiments, a method for forming a semiconductor device structure is provided. The method includes providing a substrate, a fin, and a semiconductor layer. The fin is over the substrate, the semiconductor layer is over the fin, the substrate and the fin are made of different materials, and the fin and the semiconductor layer are made of different materials. The method includes forming a dielectric layer over the semiconductor layer and the fin. The method includes forming a semiconductor structure over a sidewall of the dielectric layer. The method includes removing a first top portion of the dielectric layer over a top surface of the semiconductor layer. The method includes forming a gate over the semiconductor layer, the dielectric layer, and the semiconductor structure.

In accordance with some embodiments, a method for forming a semiconductor device structure is provided. The method includes providing a substrate, a fin, and a semiconductor layer. The fin is over the substrate, the semiconductor layer is over the fin. The substrate and the semiconductor layer are made of a first material, the fin is made of a second material, and the first material is different from the second material. The method includes forming a first dielectric layer over a first sidewall of the semiconductor layer and a second sidewall of the fin. The method includes forming a semiconductor structure over the first dielectric layer. The method includes forming a gate over the semiconductor layer, the first dielectric layer, and the semiconductor structure.

In accordance with some embodiments, a semiconductor device structure is provided. The semiconductor device structure includes a substrate. The semiconductor device structure includes a fin over the substrate. The semiconductor device structure includes a dummy fin over the substrate and spaced apart from the fin, wherein a first top surface of the fin is lower than a second top surface of the dummy fin. The semiconductor device structure includes a gate stack wrapped around the fin and adjacent to the dummy fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    providing a substrate, a fin, and a semiconductor layer, wherein the fin is over the substrate, the semiconductor layer is over the fin, the substrate and the fin are made of different materials, and the fin and the semiconductor layer are made of different materials;
    forming a dielectric layer over the semiconductor layer and the fin;
    forming a semiconductor structure over a sidewall of the dielectric layer;
    removing a first top portion of the dielectric layer over a top surface of the semiconductor layer, wherein the forming of the semiconductor structure over the sidewall of the dielectric layer and the removing of the first top portion of the dielectric layer over the top surface of the semiconductor layer comprise:
        forming a semiconductor material layer over the dielectric layer; and
        removing a second top portion of the semiconductor material layer and the first top portion of the dielectric layer, wherein the semiconductor material layer remaining over the sidewall of the dielectric layer forms the semiconductor structure; and
    forming a gate over the semiconductor layer, the dielectric layer, and the semiconductor structure.

2. The method for forming the semiconductor device structure as claimed in claim 1, wherein the forming of the gate over the semiconductor layer, the dielectric layer, and the semiconductor structure comprises:
    forming a gate layer over the semiconductor layer, the dielectric layer, and the semiconductor structure;
    forming a mask layer over the gate layer, wherein the mask layer exposes a first portion of the gate layer; and
    removing the first portion of the gate layer.

3. The method for forming the semiconductor device structure as claimed in claim 2, wherein the removing of the first portion of the gate layer further removes second portions of the semiconductor layer, the dielectric layer, and the semiconductor structure originally under the first portion of the gate layer.

4. The method for forming the semiconductor device structure as claimed in claim 1, wherein the removing of the second top portion of the semiconductor material layer and the first top portion of the dielectric layer comprises:
    performing a planarization process over the semiconductor material layer until the top surface of the semiconductor layer is exposed.

5. The method for forming the semiconductor device structure as claimed in claim 1, wherein the gate and the semiconductor layer are made of a first material.

6. The method for forming the semiconductor device structure as claimed in claim 5, wherein the semiconductor structure is made of the first material.

7. The method for forming the semiconductor device structure as claimed in claim 1, further comprising:
    forming an adhesive layer over the fin, wherein the semiconductor layer is over the adhesive layer.

8. The method for forming the semiconductor device structure as claimed in claim 7, wherein the dielectric layer is in direct contact with the adhesive layer.

9. The method for forming the semiconductor device structure as claimed in claim 7, wherein the adhesive layer, the fin, and the semiconductor layer are made of different materials.

10. A method for forming a semiconductor device structure, comprising:
    providing a substrate, a fin, and a semiconductor layer, wherein the fin is over the substrate, the semiconductor layer is over the fin, the substrate and the semiconductor layer are made of a first material, the fin is made of a second material, and the first material is different from the second material;

forming a first dielectric layer over a first sidewall of the semiconductor layer and a second sidewall of the fin;

forming a semiconductor structure over the first dielectric layer;

forming a gate over the semiconductor layer, the first dielectric layer, and the semiconductor structure;

forming a spacer layer over a third sidewall of the gate;

removing portions of the fin exposed by the gate and the spacer layer to form recesses in the fin;

forming source/drain structures in the recesses;

forming a second dielectric layer over the gate, the spacer layer, and the source/drain structures;

performing a planarization process over the second dielectric layer until the gate is exposed;

removing the gate, the semiconductor layer, the first dielectric layer, and the semiconductor structure to form a trench in the spacer layer; and forming a metal gate stack in the trench.

11. The method for forming the semiconductor device structure as claimed in claim 10, wherein the semiconductor structure is thicker than the semiconductor layer.

12. The method for forming the semiconductor device structure as claimed in claim 10, wherein the semiconductor structure is thicker than the fin.

13. The method for forming the semiconductor device structure as claimed in claim 10, wherein the semiconductor layer is thinner than the fin.

14. A method for forming a semiconductor device structure, comprising:

providing a substrate, a fin, and a semiconductor layer, wherein the fin is over the substrate, the semiconductor layer is over the fin;

forming a first dielectric layer over a first sidewall of the semiconductor layer and a second sidewall of the fin;

forming a semiconductor structure over the first dielectric layer;

forming a gate over the semiconductor layer, the first dielectric layer, and the semiconductor structure, wherein the gate and the semiconductor layer are made of a first material, the fin is made of a second material, and the first material is different from the second material;

forming a second dielectric layer over the substrate, wherein the gate is embedded in the second dielectric layer;

removing the gate, the semiconductor layer, and the semiconductor structure to form a trench in the second dielectric layer; and forming a metal gate stack in the trench and over the fin.

15. The method for forming the semiconductor device structure as claimed in claim 14, wherein the semiconductor structure is made of the first material.

16. The method for forming the semiconductor device structure as claimed in claim 14, further comprising:

removing the first dielectric layer before the metal gate stack is formed.

17. The method for forming the semiconductor device structure as claimed in claim 14, wherein the first dielectric layer extends into the metal gate stack.

18. The method for forming the semiconductor device structure as claimed in claim 14, wherein the a first top surface of the first dielectric layer is closer to a second top surface of the metal gate stack than a third top surface of the fin.

19. The method for forming the semiconductor device structure as claimed in claim 14, wherein the first dielectric layer has a U-like shape.

20. The method for forming the semiconductor device structure as claimed in claim 14, wherein the first dielectric layer surrounds a lower portion of the metal gate stack.

* * * * *